United States Patent
Kanitz et al.

(10) Patent No.: US 7,951,874 B2
(45) Date of Patent: May 31, 2011

(54) NON-CONJUGATED POLYMERIC PERARYLATED BORANES, USE THEREOF AS ORGANICALLY SEMICONDUCTOR TRANSMITTERS AND/OR TRANSPORT MATERIALS, METHODS FOR PRODUCING SAME AND USES THEREOF

(75) Inventors: Andreas Kanitz, Höchstadt (DE); Wolfgang Rogler, Möhrendorf (DE); Jasmin Woerle, Fuerth (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1174 days.

(21) Appl. No.: 10/555,982

(22) PCT Filed: May 7, 2004

(86) PCT No.: PCT/EP2004/004901
§ 371 (c)(1),
(2), (4) Date: May 18, 2006

(87) PCT Pub. No.: WO2004/099291
PCT Pub. Date: Nov. 18, 2004

(65) Prior Publication Data
US 2006/0229431 A1    Oct. 12, 2006

(30) Foreign Application Priority Data
May 8, 2003 (DE) .................. 103 20 713
Jan. 13, 2004 (DE) .................. 10 2004 001 865

(51) Int. Cl.
C08F 275/00 (2006.01)
C08G 79/08 (2006.01)
H01L 51/05 (2006.01)
H01L 51/30 (2006.01)
H01L 51/42 (2006.01)

(52) U.S. Cl. .................. 525/251; 528/394

(58) Field of Classification Search .................. 528/394; 525/251
See application file for complete search history.

(56) References Cited

U.S. PATENT DOCUMENTS 3,213,136 A   10/1965  Washburn et al.
5,807,905 A   9/1998   Cunningham et al.
6,057,078 A   5/2000   Cunningham et al.

FOREIGN PATENT DOCUMENTS

| CN | 1160058    | 9/1997  |
| EP | 0775706    | 5/1997  |
| EP | 1142895    | 10/2001 |
| JP | 2000294373 | 10/2000 |
| JP | 2003031368 | 1/2003  |

OTHER PUBLICATIONS

Noriyoshi Matsumi et al., "Poly(p-phenylene-borane)s. Novel Organoboron π-Conjugated Polymers via Grignard Reagent", *J. Am. Chem. Soc.* 1998, 120 p. 10776-10777.

M. Kinoshita et al., A Novel Family of Boron-Containing Hole-Blocking Amorphous Molecular Materials for Blue-and Blue-Violet-Emitting Organic Electroluminescent Devices, *Adv. Funct. Mater.*, 12, vol. No. 11-12, Dec. 2002.

Gompper et al., Synthesis of Oligo(diazaphenyls). Tailor-Made Fluorescent Heteroaromatics and Pathways to Nanostructures, *Feature Article*, (1997).

*Primary Examiner* — Duc Truong
(74) *Attorney, Agent, or Firm* — Cohen Pontani Lieberman & Pavane LLP

(57) ABSTRACT

A K type of copolyarylborane:

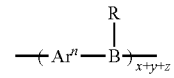

wherein hydrogen atoms are bonded to the ends; $Ar^n$ represents at least one of $Ar^1$, $Ar^2$, and $Ar^3$; each of $Ar^1$ and $Ar^2$ represents an arylene radical; $Ar^3$ represents an heteroaromatic arylene radical; $Ar^1$ has a π electron density of no less than that of benzene; $Ar^2$ is capable of hole transport; $Ar^3$ has a π electron density of no greater than that of benzene and less than that of $Ar^1$; x, y, and z respectively represent the molar parts of $Ar^1$, $Ar^2$, and $Ar^3$; each of x, y, and z is in the range of 0-1, and $x+y+z=1$; and R represents an aryl radical. This K type of copolyarylborane may be of use for organic light-emitting diodes (OLEDs), organic solar cells, organic photodetectors, and organic field-effect transistors.

16 Claims, 3 Drawing Sheets

NON-CONJUGATED POLYMERIC PERARYLATED BORANES, USE THEREOF AS ORGANICALLY SEMICONDUCTOR TRANSMITTERS AND/OR TRANSPORT MATERIALS, METHODS FOR PRODUCING SAME AND USES THEREOF

RELATED APPLICATIONS

This is a U.S. national stage of application No. PCT/EP2004/004901, filed on May 7, 2004. Priority is claimed on the following application(s): Country: Germany, Application No.: 103 20 713.9, Filed: May 8, 2003, Country: Germany, Application No.: 102004001865.0, Filed: Jan. 13, 2004 the content of which is incorporated here by reference.

FIELD OF THE INVENTION

The invention relates to luminophoric compounds with semiconducting properties and to their preparation and their use in organic light-emitting diodes (OLEDs), organic solar cells, organic photodetectors and organic field-effect transistors.

BACKGROUND OF THE INVENTION

"Small molecules" (i.e. single molecules with luminophoric properties for OLED applications) with perarylated borane structures are disclosed, for example, by the publication of M. Kinoshita et al./"Boron containing materials for blue/blue-violet Electroluminescence".

A disadvantage of the small molecules is that they are difficult to apply because single molecules cannot be produced as OLED layers by spincoating or other coating methods such as printing processes, but rather entail costly application methods such as vapor deposition processes.

SUMMARY OF THE INVENTION

It is an object of the invention to provide novel organic, polymeric, semiconducting emitter and transport materials which can be used in organic electronic devices and/or devices equipped with semiconducting materials, and which are preparatively efficiently obtainable, especially processible in mass production processes.

This and other objects are obtained in accordance with one aspect of the invention directed to an embodiment of the invention that provides copolyarylboranes of the K type

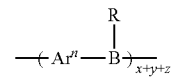

where:
x, y and z are molar parts of components and add up to 1, where two of the indices x, y and z may also have the value 0, hydrogen atoms are bonded to the ends,
$Ar^n$ represents the particular arylene component, —$Ar^1$— and/or —$Ar^2$— and/or —$Ar^3$— in the copolymer,
$Ar^1$ and $Ar^2$ each represent components having a mono or polycyclic, aromatic and/or heteroaromatic arylene structure which is bonded in a bivalent, conjugating manner, where $Ar^1$ represents a component whose π electron density is equal to or greater than that of benzene and $Ar^2$ represents a component which is capable of hole transport,
$Ar^3$ represents a component having any mono- or polynuclear heteroaromatic arylene structure which is bonded in any bivalent, conjugating manner and has low π electron density which is equal to or less than that of benzene,
where the π electron density of $Ar^3$ is in each case less than that of $Ar^1$,
and
R represents a radical which has aryl structure and, depending on the intended conjugation of the polyborane K, includes a heteroaromatic and/or a (homo)aromatic aryl radical
which is donor-free, where a conjugation in the polyborane K can be formed by application of an electrical field, and/or
in which at least one additional donor function is substituted (intrinsic formation of conjugation) and/or
its hydrogen atoms may also be substituted in any way by one or more branched or unbranched alkyl radicals or alkoxy radicals R*.

The invention further provides a process for preparing the copolyarylboranes of the K type by the general preparation scheme
Reaction Scheme:

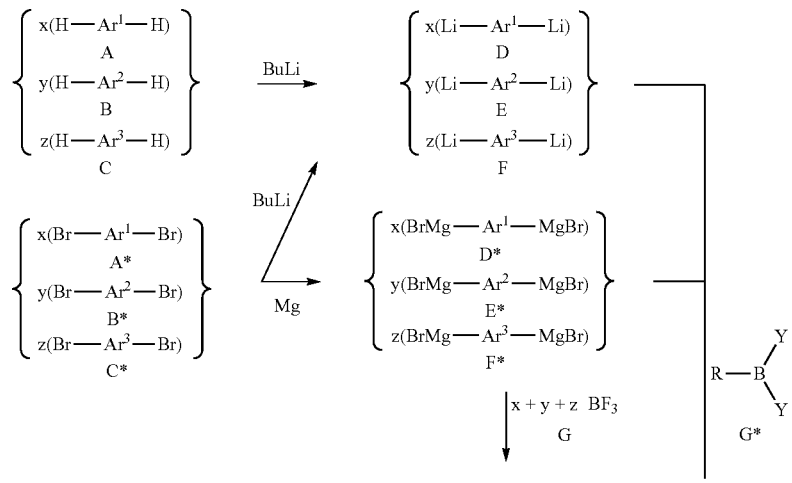

-continued

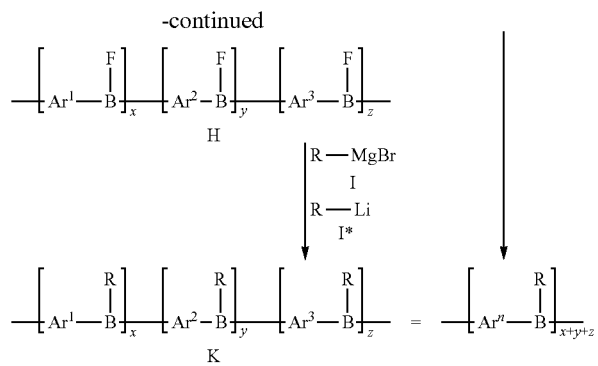

where the starting materials are the arenes A to C or the bromine-substituted arylene structures A* to C*, and these are subjected to umpolung either by a Grignard reaction (D* to F*) or by lithiation (D to F) (see scheme). Two basic reaction paths can then be utilized to form the copolyboranes K. Either the metallated compounds are converted by means of boron trifluoride G to fluorocopolyborane products H and these, without workup, are in turn converted by means of a Grignard reagent I or of a lithiated reagent I* (see scheme) to copolyboranes K in thermodynamically driven substitution reactions to form alkali metal or alkaline earth metal bromides, or the metallated compounds are converted in one step by means of an arylboron compound G directly to the copolyboranes K, where Y (see scheme) represents two halide, two alkoxy or one dioxy-alkylene structure (having from 1 to 3 carbon atoms).

An embodiment of the invention provides for the use of the copolyarylboranes of the K type in organic semiconducting elements such as light-emitting diodes and/or light-emitting diode displays, according to their composition, as an emitting layer in various colors and white,
as an electron transporting layer and/or
as a hole blocking layer
and/or with an excess of components of the $Ar^2$ type as a hole transporting layer and also as a tailored transport material in the functional layers of organic solar cells, organic photodetectors and organic field-effect transistors.

An embodiment of the invention provides for the use of the copolyarylboranes K as blends of single component polymers, i.e. in the case that two of the relative variables x, y and/or z (structural formula type K) have the value zero.

An embodiment of the invention provides for the use of the polymeric single components as material for an electroluminescent layer and/or organic semiconductor layer, i.e. electron transporting, hole blocking or hole transporting.

DETAILED DESCRIPTION OF THE PREFERRED EMBODIMENTS

Figure 1:
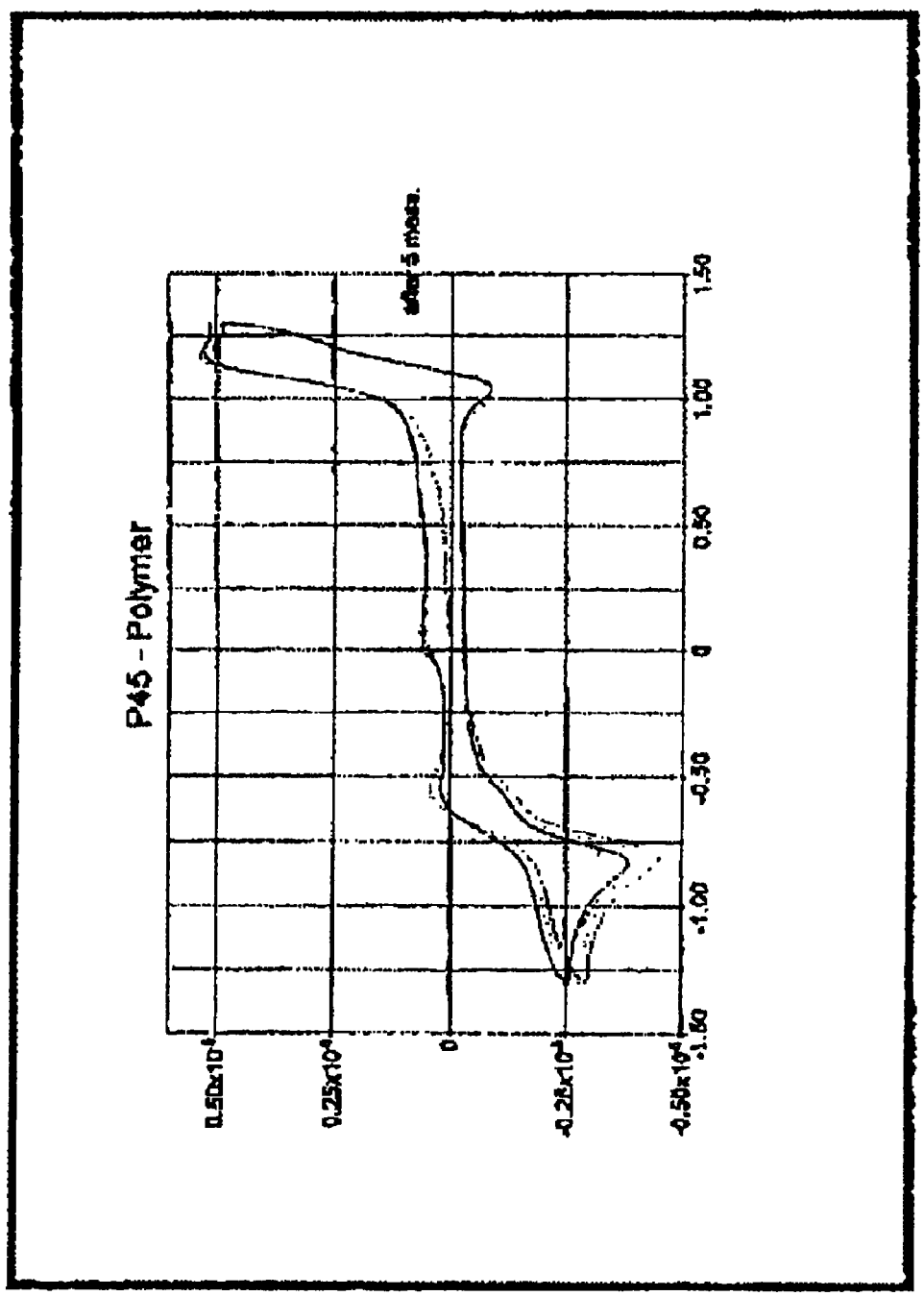
FIG. 1 shows the cyclic voltametry of polymer ac having the desired oxidative and reductive reversibility and stability over several cycles.
Figure 2:
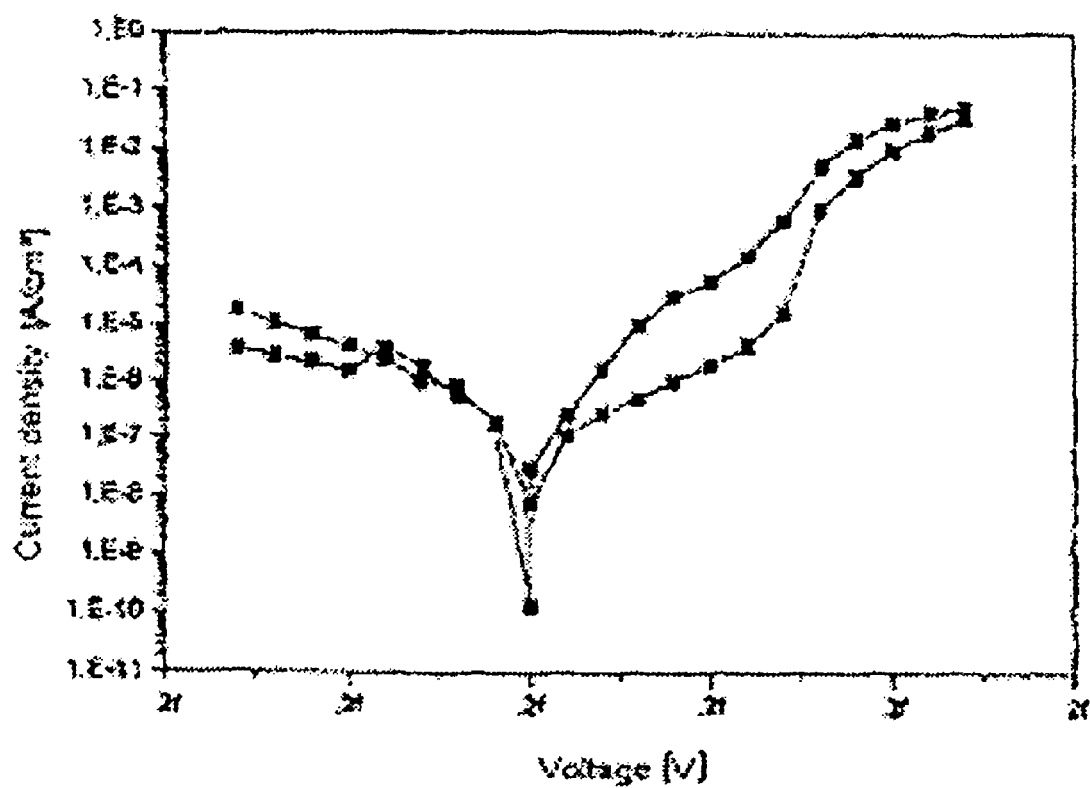
FIG. 2 shows the current density as a function of voltage for an OLED.

As discussed above $Ar^n$ represents the particular arylene components —$Ar^1$— and/or —$Ar^2$— and/or —$Ar^3$— in the copolymer, preferably one in which the environment of the boron atom is shielded (K*, K, K* types), especially by one or both ortho positions of the boron-carbon bonds of the particular arylene components $Ar^n$ and of the aryl substituents R being provided, for example, with methyl substituents, as, for example, in the bis-o,o'-dimethyl-substituted arylene $Ar^n$ or aryl components R with durene derivatives as substituents, where the solubility of all single components in organic solvents can be improved by any arrangement of one or more unbranched and/or branched alkyl or alkoxy substituents R*;

the term aryl or arylene component is understood to mean a conjugated system of at least one cyclic substructure which, in the case of a plurality of cyclic substructures, may also be interrupted by vinylene units, where the cyclic substructures are of aromatic nature, i.e. are obtained from carbon or rings consisting of carbon and other elements, whose number of $\pi$ electrons corresponds to $(4n+2)$ (n is a parameter which can assume the values from 0 to 5) and their other σ bonds, apart from one in the case of the monovalent aryl structure or two in the case of the bivalent arylene structure, are bonded to hydrogen and/or any other substituents;

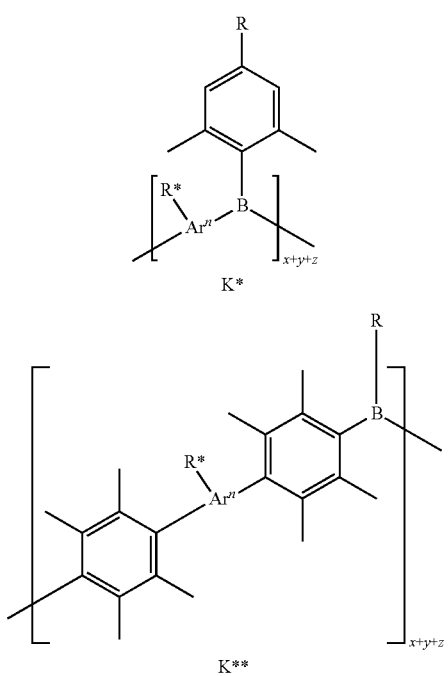

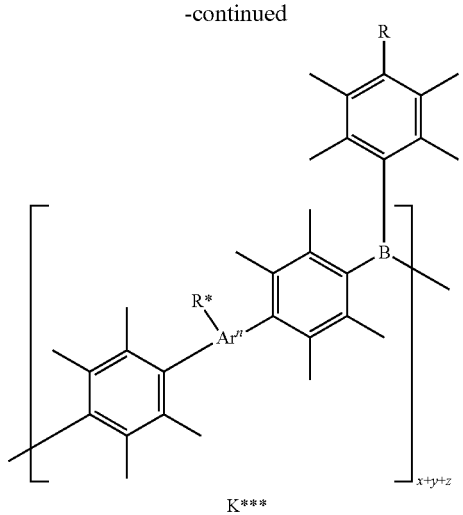

K*** where Ar¹ has an arylene structure, preferably the 2,7-fluorenylene structure, which can be substituted in the 9 position easily by unbranched and/or branched alkyl radicals, especially preferably having from 1 to 10 carbon atoms, where the term arylene structure is understood to mean any mono- or polycyclic aromatic or heteroaromatic structure which is bonded in a bivalent, conjugating manner, and whose π electron density is equal to or greater than that of benzene, as specified, for example, in Table 1 Ar¹(a-h)

TABLE 1

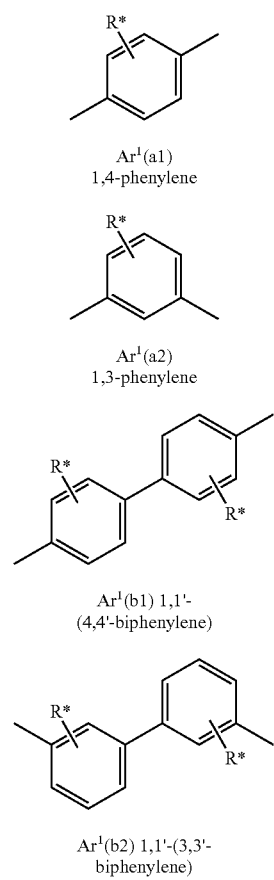

Ar¹(a1)
1,4-phenylene

Ar¹(a2)
1,3-phenylene

Ar¹(b1) 1,1'-
(4,4'-biphenylene)

Ar¹(b2) 1,1'-(3,3'-
biphenylene)

TABLE 1-continued

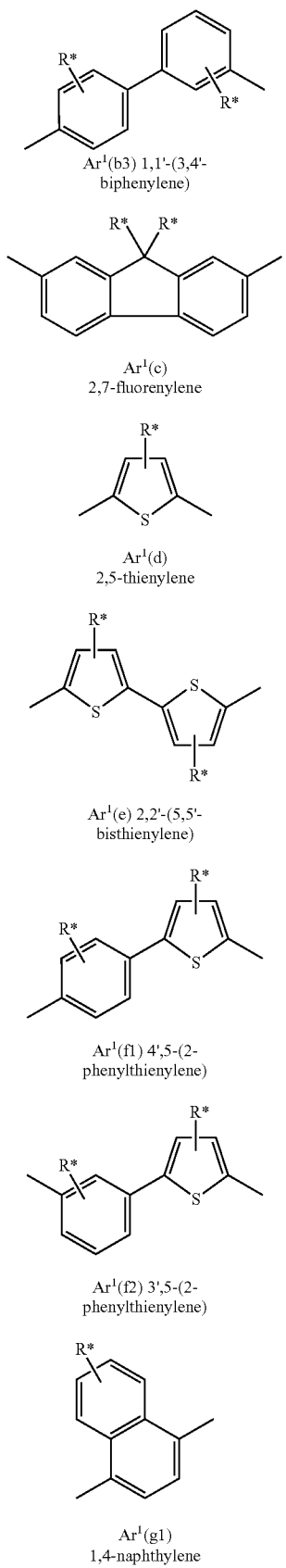

Ar¹(b3) 1,1'-(3,4'-
biphenylene)

Ar¹(c)
2,7-fluorenylene

Ar¹(d)
2,5-thienylene

Ar¹(e) 2,2'-(5,5'-
bisthienylene)

Ar¹(f1) 4',5-(2-
phenylthienylene)

Ar¹(f2) 3',5-(2-
phenylthienylene)

Ar¹(g1)
1,4-naphthylene

TABLE 1-continued

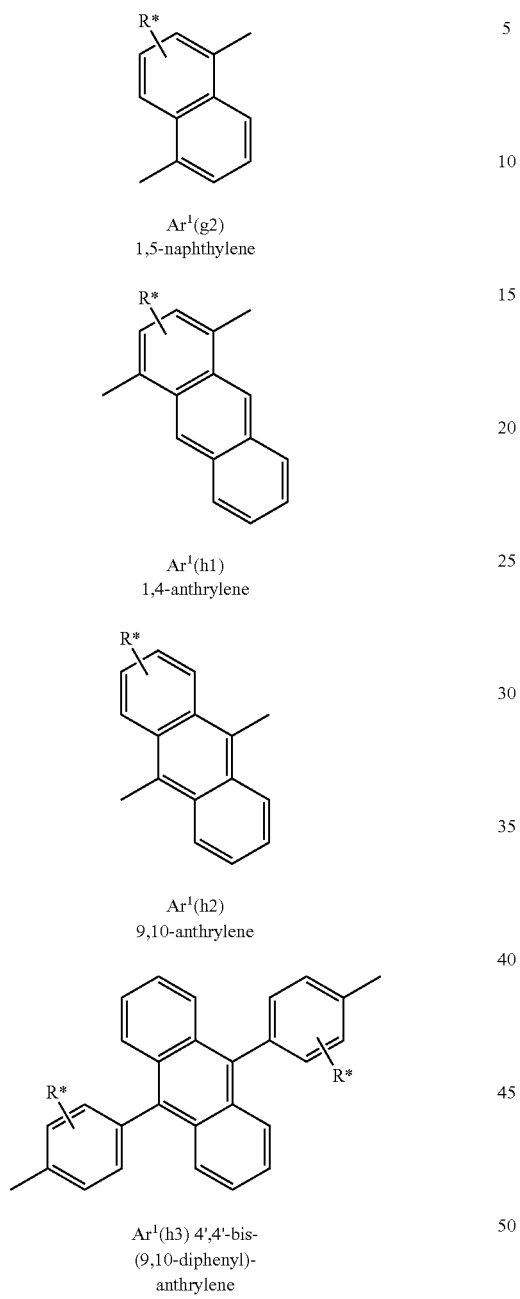

Ar¹(g2)
1,5-naphthylene

Ar¹(h1)
1,4-anthrylene

Ar¹(h2)
9,10-anthrylene

Ar¹(h3) 4',4'-bis-
(9,10-diphenyl)-
anthrylene whose solubility in organic solvents may be improved by any additional arrangement of one or more unbranched and/or branched alkyl substituents and/or alkoxy substituents arranged preferably in the ortho position to the boron atom, with especially preferably from 1 to 10 carbon atoms R*;

$Ar^2$ has an arylene structure capable of hole transport, the term arylene structure capable of hole transport being understood to mean any mono- or polycyclic aromatic and/or heteroaromatic structure which is bonded in a bivalent, conjugating manner and additionally has perarylated amine substituents attached in a conjugating manner, as specified, for example, in Table 2 $Ar^2$(a-f)

TABLE 2

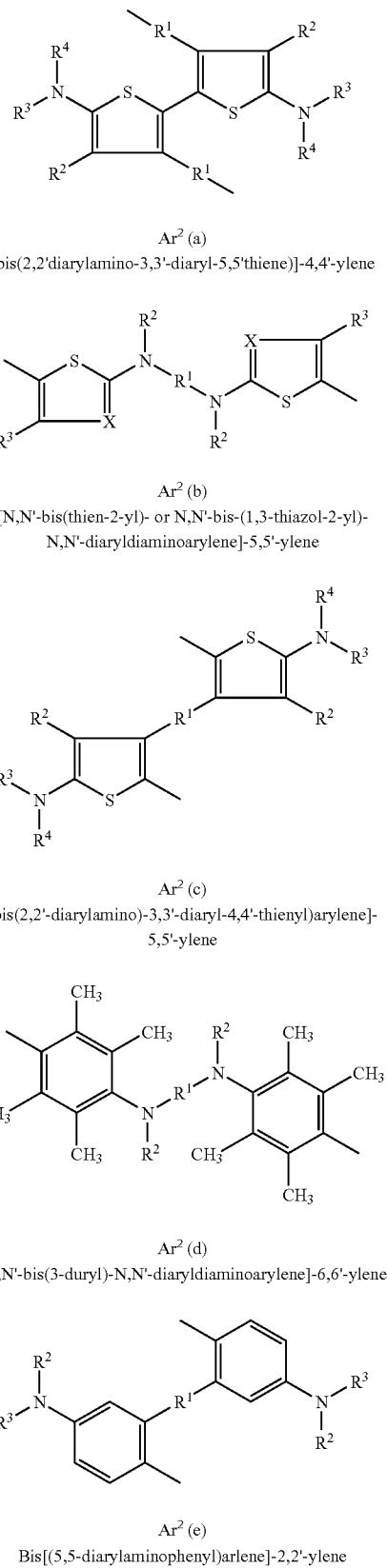

Ar²(a)
[bis(2,2'diarylamino-3,3'-diaryl-5,5'thiene)]-4,4'-ylene

Ar²(b)
[N,N'-bis(thien-2-yl)- or N,N'-bis-(1,3-thiazol-2-yl)-
N,N'-diaryldiaminoarylene]-5,5'-ylene Ar²(c)
[bis(2,2'-diarylamino)-3,3'-diaryl-4,4'-thienyl)arylene]-
5,5'-ylene Ar²(d)
[N,N'-bis(3-duryl)-N,N'-diaryldiaminoarylene]-6,6'-ylene Ar²(e)
Bis[(5,5-diarylaminophenyl)arlene]-2,2'-ylene TABLE 2-continued

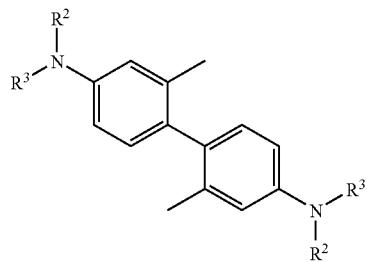

Ar² (f)
bis(4,4'-diarylaminophenyl)2,2'-ylene where the substituents R², R³ and R⁴ are aryl substituents, preferably phenyl, 1-naphthyl, 2-naphthyl, whose solubility in organic solvents can be improved by any additional arrangement of one or more unbranched and/or branched alkyl substituents and/or alkoxy substituents preferably arranged in the ortho position to the boron atom, especially preferably having from 1 to 10 carbon atoms; the definitions of the substituents R″ with the same index n are identical and/or the definition of the substituents R¹ is the same as the substituent selection for the arylene component Ar¹, preferably 9,9-dialkyl-2,7-fluorenylene Ar¹(c) type or 3,6-durylene Ar¹(a) type;

for Ar²(b), x is also N or C—R⁴;

Ar³ has an arylene structure with low π electron density, the term arylene structure with low π electron density being understood to mean any mono- or polycyclic heteroaromatic structure which is bonded in a bivalent, conjugating manner and whose π electron density is equal to or less than that of benzene, as specified, for example, in Table 3 Ar³(a-m)

TABLE 3

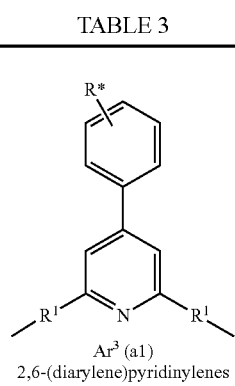

Ar³ (a1)
2,6-(diarylene)pyridinylenes

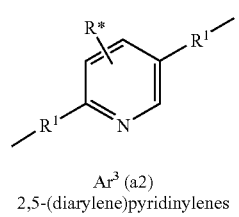

Ar³ (a2)
2,5-(diarylene)pyridinylenes

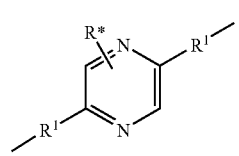

Ar³ (b)
2,5-(diarylene)pyrazinylenes

TABLE 3-continued

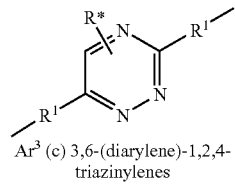

Ar³ (c) 3,6-(diarylene)-1,2,4-triazinylenes

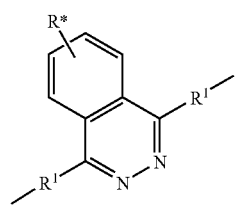

Ar³ (d1)
1,4-(diarylene)phthalazinylenes

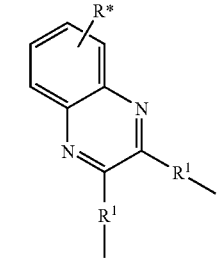

Ar³ (d2)
2,3-(diarylene)quinoxalinylenes

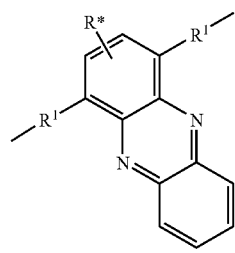

Ar³ (d3)
1,4-(diarylene)phenazinylenes

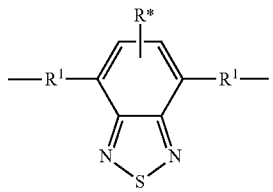

Ar³ (e)
1,4-(diarylene)benzo-thiadiazolylenes

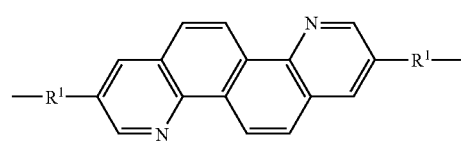

Ar³ (f)
3,9-(diarylene)-1,7-diaza-chrysenylenes

TABLE 3-continued

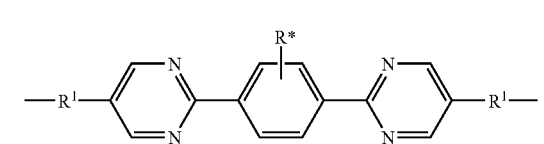

Ar³ (g1)
bis(2,2'-(diarylene)-
pyrimidin-5,5'-ylene)arylenes

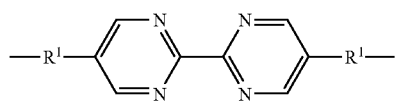

Ar³ (g2)
2,2-pyrimidine-5,5-
(diarylene)-ylenes

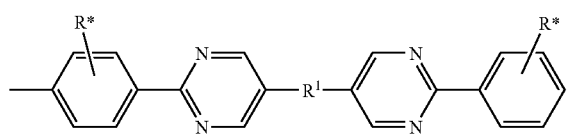

Ar³ (h)
bis[5,5'-(diarylene)-
pyrimidin-2,2'-ylene]arylenes

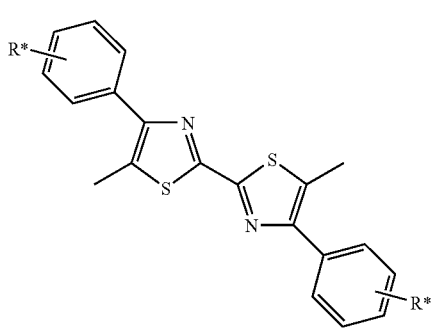

Ar³ (i1)
2,2'-(5,5'-bis-1,3-
thiazolylenes)

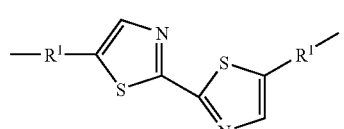

Ar³ (i2)
2,2'-(5,5'arylenebis-1,3-
thiazolylenes)

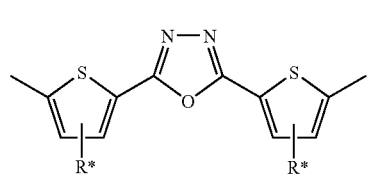

Ar³ (j1)
5,5'-bis[2,5-(di-2',2'-
thienyl)oxadiazolylenes]

TABLE 3-continued

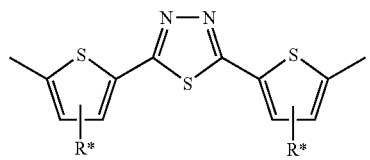

Ar³ (j2)
5,5'-bis(2,5-(di-2',2'-
thienyl)thiadiazolylenes]

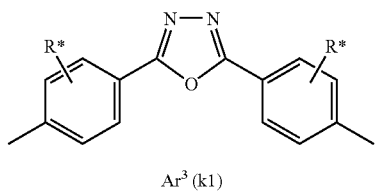

Ar³ (k1)
4',4'-bis(2,5-diphenyl-
oxadiazolylenes)

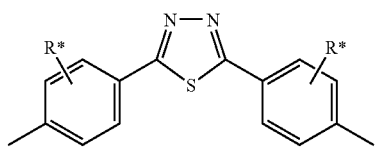

Ar³ (k2)
4',4'-bis(2,5-diphenyl-
thiadiazolylenes)

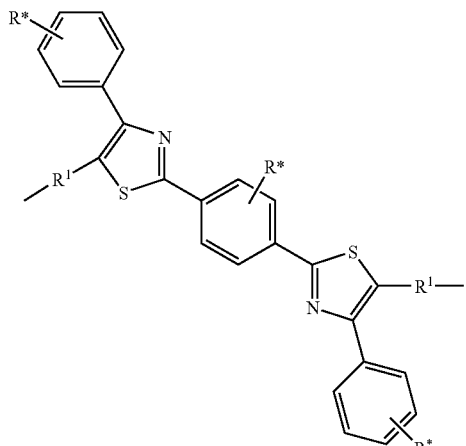

Ar³ (l1)
2,2'-(5,5'-arylenebis-1,3-
thiazolylene)arylenes

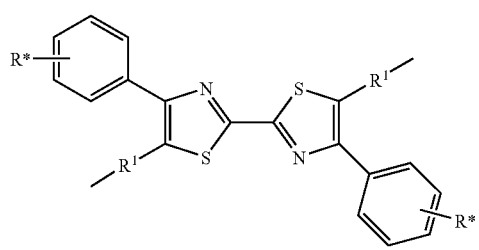

Ar³ (l2)
2,2'-(5,5'arylenebis-1,3-
thiazolylenes)

TABLE 3-continued

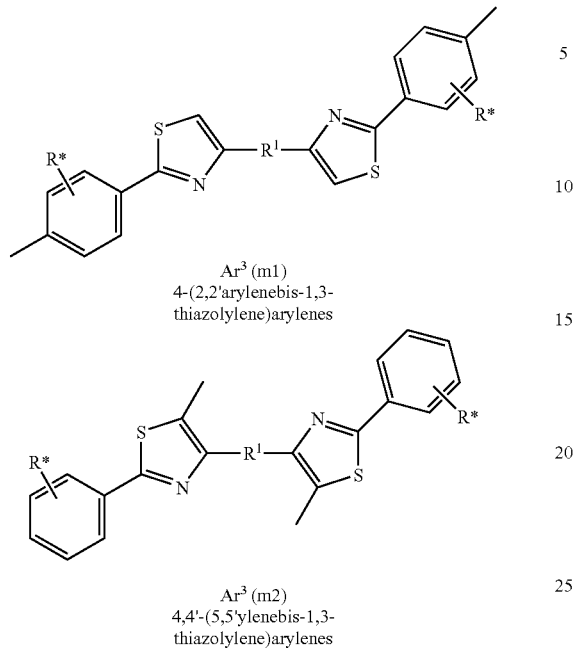

Ar³ (m1)
4-(2,2'arylenebis-1,3-
thiazolylene)arylenes

Ar³ (m2)
4,4'-(5,5'ylenebis-1,3-
thiazolylene)arylenes whose solubility in organic solvents can be improved by any additional arrangement of one or more unbranched and/or branched alkyl substituents and/or alkoxy substituents preferably arranged in the ortho position to the boron atom, especially having from 1 to 10 carbon atoms R*; the definition of the substituents $R^1$ is the same as the substituent selection for the arylene component $Ar^1$, preferably 9,9-dialkyl-2,7-fluorenylene $Ar^1(c)$ type or 3,6-durylene $Ar^1(a)$ type;
where the π electron density of $Ar^3$ is in each case less than that of $Ar^1$,
and
R represents a radical with aryl structure which, depending on the intended conjugation of the polyborane K, includes a heteroaromatic and/or a (homo)aromatic aryl radical which
  [R(a1-a5)] is donor free, where a conjugation in the polyborane K can be formed by applying an electrical field, and/or
  [R(b-e)] in which at least one additional donor function is substituted (intrinsic formation of conjugation) and/or
  whose hydrogen atoms may also be substituted in any way by one or more branched or unbranched alkyl radicals or alkoxy radicals R*, preferably having from 1 to 10 carbon atoms;
R may, in the polyborane K in the case of intrinsic formation of conjugation, also be an N-carbazolyl radical R(f).
Preferred aryl structures for R are specified in Table 4 R(a-f):

TABLE 4

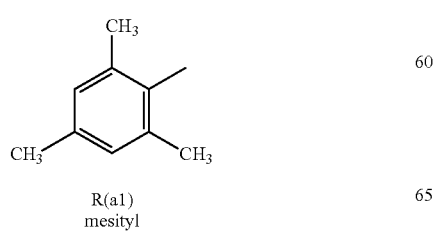

R(a1)
mesityl

TABLE 4-continued

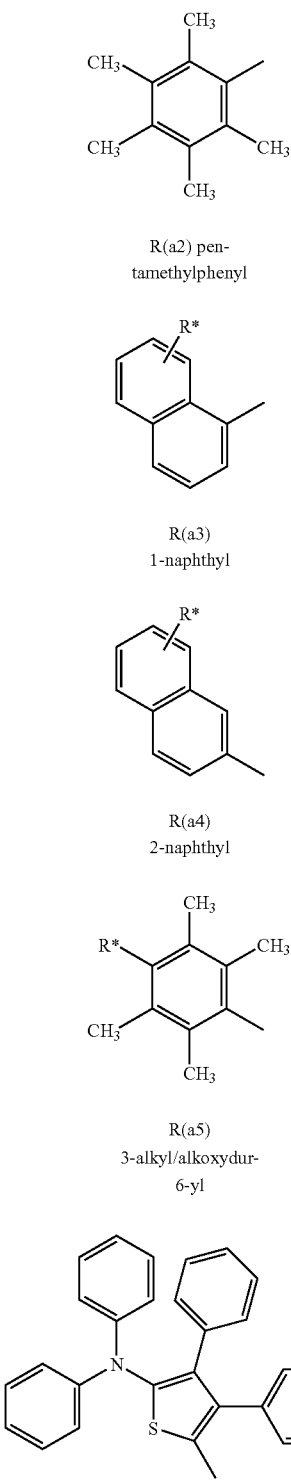

R(a2) pentamethylphenyl

R(a3)
1-naphthyl

R(a4)
2-naphthyl

R(a5)
3-alkyl/alkoxydur-6-yl

R(b1)
2-diphenylamino
3,4-diphenylthien-5-yl

TABLE 4-continued
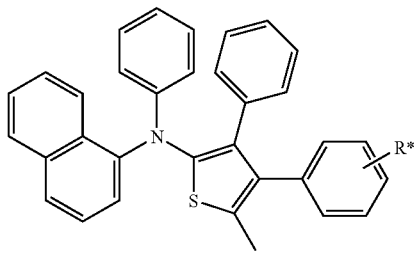
R(b2)
2-[(1-naphthyl)-
phenylamino] 3,4-
diphenylthien-5-yl
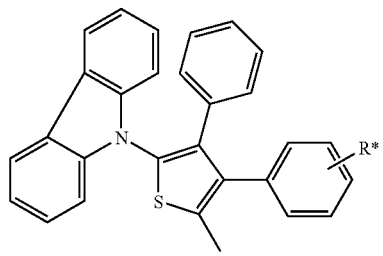
R(b3)
2-(N-carbazoyl)
3,4-dipheny]thien-
5-yl
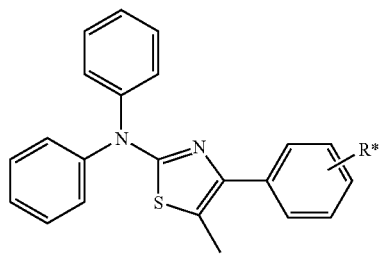
R(c1)
2-diphenylamino
3,4-diphenyl-1,3-
thiazol-5-yl
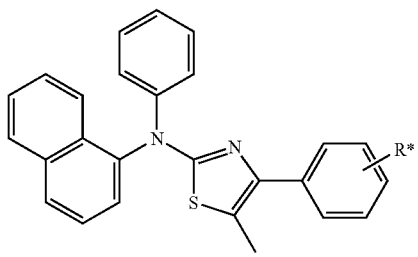
R(c2)
2-[(1-naphthyl)-
phenylamino]-3,4
diphenyl-1,3
thiazol-5-yl
TABLE 4-continued
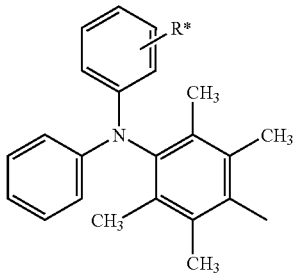
R(d1)
3-diphenylamino-
dur-6-yl
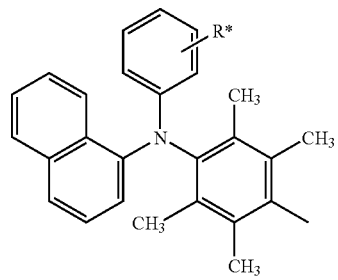
R(d2)
3-[(1-naphthyl)-
phenylamino]dur-6-
yl
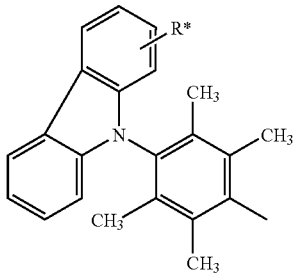
R(d3)
3-(N-carbazoyl)-
dur-6-yl
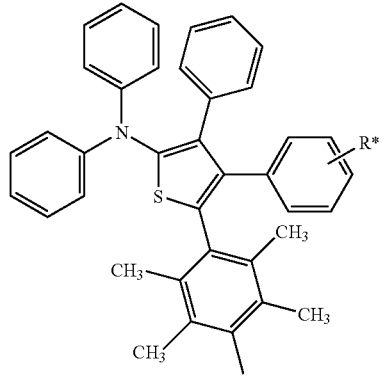
R(e1)
2-diphenylamino-
3,4-diphenyl-5-(3-
dur-6-yl)thiophene

TABLE 4-continued

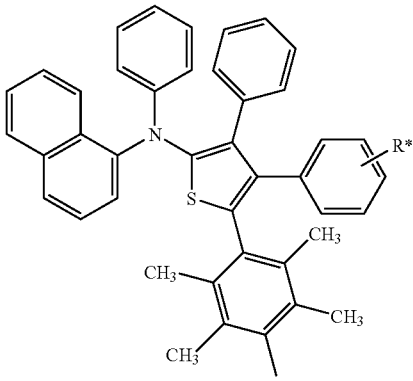

R(e2)
2-[(1-naphthyl)-
phenylamino]-3,4
diphenyl-5-(3-dur-
6-yl)thiophene

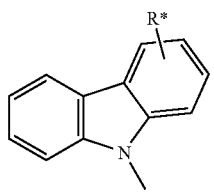

R(f)
N-carbazoyl x, y and z (structural formula type K) are the relative numbers which specify in which ratios relative to one another the polymeric single components are copolymerized. The polymeric individual components may also each alone be utilized as a material for an electroluminescent layer and/or organic semiconductor layer (electron transporting, hole blocking or hole transporting).

$Ar^1$ has an arylene structure and is the arylene component of a preferred polymer material which emits in the blue to green spectral region as the single component polyborane and has very good electron transport properties by virtue of the trivalent, $sp^2$-hybridized boron with vacant p orbital; also, $Ar^1$ preferably has substituents which are capable of imparting solubility to the polymer which forms.

$Ar^2$ is the arylene component of a further preferred polymer material for optimal adjustment of the hole transport properties and for the longer-wavelength emission correction of the copolymer for white balancing and $Ar^3$ is the arylene component of a further preferred polymer material which, by virtue of its low π electron density, emits in the blue and also serves for shorter wavelength color equalization of the emission of the copolymer, for example for attaining the white point. In addition, the polymer material comprises substituted arylene moieties, in particular of the $R^1$ type, for improving the solubility.

In addition, the possibility also exists of synthesizing copolyboranes which do not consist only of in each case one of the arylene components $Ar^1$ and/or $Ar^2$ and/or $Ar^3$, but rather it is also possible for a plurality of arylene components in each case of the three structural types to be copolymerized with one and/or more arylboron compounds of the G* type.

General Description of the Synthetic Route:

Starting from the starting synthons, the arylenes A, B and C or the dibromoarylene derivatives A*, B* and C*, lithiation reactions are carried out by means of butyllithium in tetrahydrofuran at −78° C. and Grignard reactions with magnesium in tetrahydrofuran at 65° C. The lithiated products D, E and F are then reacted individually or in any desired ratios with boron trifluoride etherate G first at room temperature and later in boiling THF, in such a way that the molar sum of the lithiated components corresponds to the molar amount of the boron halide. The reaction of the bifunctional lithiated components leads only to one linear copolyfluoroaryleneborane H. Copolyfluoroaryleneboranes H are likewise obtained when the Grignard products D*, E* and F* are reacted individually or in any desired ratios with boron trifluoride etherate G in boiling THF, in such a way that the molar sum of the Grignard components corresponds to the molar amount of the boron halide. The reaction of the bifunctional Grignard components likewise leads only to one linear copolyfluoroaryleneborane H.

Afterward, in analogy to the bifunctional metallated compounds, a further monofunctional Grignard component I or lithiated component I* is synthesized and, after exchange of the THF solvent for toluene (now in boiling toluene), added dropwise in the molar ratio to the copolyfluoroaryleneborane H synthesized beforehand. After boiling at approx. 120° C. for 5 hours, this leads to the substitution of the remaining fluorine by the aryl radical of the Grignard component I to form a copolyarylborane derivative K.

A further means of preparing the copolyarylborane derivatives K is offered by the substitution reaction from the lithiated compounds A, B and C or from the Grignard compounds A*, B* and C* and the arylboric esters or arylboron halides G* in stoichiometric ratios. The reactions are started in THF beginning at room temperature and increased to boiling temperature within 2 hours, then the tetrahydrofuran solvent is exchanged for toluene by distillation and the reaction is completed by heating at reflux for a further 4 to 6 hours.

The copolyaryleneboranes K which have been synthesized by one of the two synthetic routes shown are worked up by extracting the salts into water and repeatedly precipitating the polymer solution which has been concentrated in each case in methanol, as a result of which copolyaryleneboranes K have tailored electrical and optical properties owing to their component ratios.

An embodiment of the invention relates to non-conjugated luminophoric compounds having semiconducting properties and to their preparation and their use in organic light-emitting diodes (OLEDs), organic solar cells, organic photo-detectors and organic field-effect transistors. These are copolyarylboranes of the K type which are only converted by application of a suitable electrical field and/or by donor substitution of the aryl substituent R to a structure type which behaves like a conjugated polymer

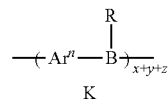

K with the definitions of the symbols specified in claim 1.

EMBODIMENTS

Synthesis of Conjugated, Condensed and Oligoaryl Systems A

In the case that the aryl systems A are not commercially available, they are prepared by known C—C bond-forming reactions (for example Suzuki coupling); beforehand, alkylations or alkoxylations are carried out on at least one coupling unit in order to aim for good solubility of the polymeric materials to be formed therefrom.

Example 1

Synthesis of 2,7-di(2,3,5,6-tetramethylphenyl)-9,9-diheptylfluorene

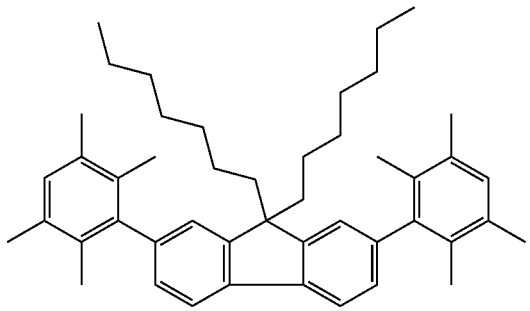

a) Preparation of 9,9-diheptylfluorene 0.2 mol of fluorene is dissolved in 300 ml of DMSO at 80° C. 0.01 mol of phase transfer catalyst (aliquot) is added to the solution which is stirred for a further 5 minutes. For the alkylation, 0.5 mol of 50% sodium hydroxide solution and 0.5 mol of heptyl bromide are required. The addition is effected in three stages, and commences with the addition of one third of the amount of sodium hydroxide solution used. The solution changes color to deep red and slowly becomes yellow by addition of heptyl bromide. When the solution has become yellow, the second third of sodium hydroxide solution is added, etc. The end of the reaction is checked by means of TLC on RP18 in acetonitrile.

The reaction mixture is extracted three times with ether and water and the organic phase is removed.

After all solvents (ether, DMSO, heptanol) have been distilled off, the product is present in the form of a yellow oil (HPLC monitoring); it is processed further as the crude product.

b) Preparation of 2,7-dibromo-9,9-diheptylfluorene 0.2 mol of diheptylfluorene is dissolved in 300 ml of chloroform and heated to boiling. Under dark conditions, 0.4 mol of bromine dissolved in chloroform is slowly added dropwise. The reaction is stirred at boiling for approx. 12 hours. When the reaction solution has become decolorized, the bromination has ended (TLC monitoring on RP18 in acetonitrile). After the solution has cooled, all of the chloroform is distilled off and the product is precipitated in methanol as white crystals. After chromatography of the product on silica gel in cyclohexane, HPLC-pure product is obtained, mp: 45-6° C.

c) Preparation of durylboronic Acid 0.2 mol of 3-bromodurene is reacted in 800 ml of absolute THF by means of 0.25 mol of butyllithium under inert conditions at −78° C. On completion of the BuLi addition, the reaction mixture is stirred at −78° C. for another 1 h and then allowed to thaw. A 2 l flask is then initially charged with 500 ml of absolute ether and 0.3 mol of trimethyl borate at −78° C. and the duryllithium prepared beforehand is added dropwise within a period of 30 min. The mixture is then allowed to thaw and the reaction mixture is stirred for another 12 h. Finally, the reaction mixture is poured onto 2 N HCl-ice mixture and hydrolyzed for 12 h, the organic phase is extracted and concentrated, and the residue is admixed with pentane to precipitate out the product. The product is filtered off with suction and dried under reduced pressure mp: 101-3° C.

d) Preparation of 2,7-di(2,3,5,6-tetramethylphenyl)-9,9-diheptylfluorene 0.04 mol of durylboronic acid is initially charged in a 1-liter 3-neck flask with 600 ml of toluene, admixed with 0.04 mol of propane-1,3-diol and heated on a water separator until no further water is separated out. Afterward, the water separator is removed and replaced by a reflux condenser, and 0.01 mol of 2,7-dibromo-9,9-diheptylfluorene and 11.6 g of potash dissolved in 42 ml of water are added to the reaction mixture. The flask is then repeatedly evacuated under reduced pressure and flooded with argon in order to add the catalyst, tetrakis(triphenylphosphine)palladium. Finally, the mixture is heated to 110° C. for 48 h and purged with argon during this time. For workup, the organic phase is washed repeatedly with water, extracted and concentrated to dryness. The residue is washed in methanol and filtered off with suction. The crude product is purified by chromatography on silica gel by means of cyclohexane.

Checking of the product by HPLC-MS coupling, mp: 177-8° C.

Synthesis of Donor-Substituted, Fused and Oligoaryl Systems B

Example 2

Formation of the Structures Ar$^2$(b)

a) Synthesis of Arylated biscarboxamides

In a 2 l three-neck flask with reflux condenser, magnetic stirrer, dropping funnel and inert gas supply, 1 mol in each case of a secondary arylated bisamine is dissolved in 600 ml of dioxane. The carbonyl halide required in each case is then added dropwise in the equivalent amount. Subsequently, the reaction mixture is heated under reflux until the entire amount of the hydrohalide formed in the reaction has been removed from the inert gas stream. Thin-layer chromatography monitoring allows the end of the reaction to additionally be detected. The reaction solution is then cooled and stirred into at least twice the amount of water. In most cases, this separates out an oil which has solidified after a few hours. The aqueous phase is removed and the crude product is recystallized from ethanol. The yield is in each case at least 90%.

aa) N,N'-Di(2-phenylacetyl)-N,N'-diphenylphenylene-1,4-diamine

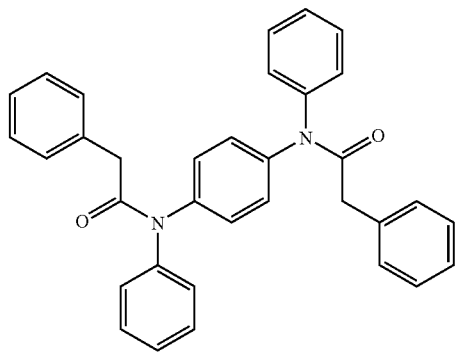

In this way, N,N'-di(2-phenylacetyl)-N,N'-diphenylphenylene-1,4-diamine (mp: 190° C.), for example, is prepared from N,N'-diphenyl-p-phenylenediamine and 2-phenylacetyl chloride.

b) Synthesis of Arylated Bisthiocarboxamides 0.5 mol of the particular arylated biscarboxamide and the equivalent amount of Lawesson reagent (prepared from anisole and phosphorus pentasulfide) are suspended in 750 ml of diglycol diethyl ether in a reflux apparatus with inert gas supply, and then stirred at 100° C. for 6 h. This forms a clear solution from which the reaction product crystallizes out in some cases under cold conditions. In order to isolate the product fully, the reaction mixture is stirred into double the amount of water; the oily phase which often forms is then allowed to crystallize. Afterward, the product is removed from the aqueous phase and recrystallized from methanol. The yield is in each case at least 90%.

ba: N,N'-Di(2-phenylthioacetyl)-N,N'-diphenylphenylene-1,4-diamine

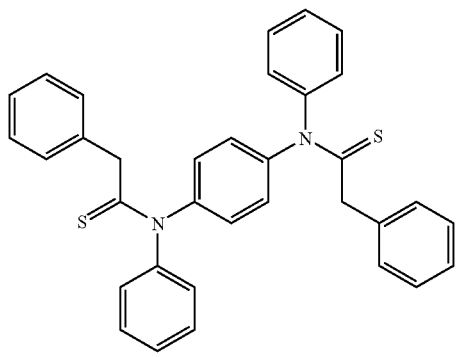

In this way, N,N'-di(2-phenylthioacetyl)-N,N'-diphenylphenylene-1,4-diamine (mp: 224-227° C.), for example, is prepared from N,N'-di(2-phenylacetyl)-N,N'-diphenylphenylene-1,4-diamine and the Lawesson reagent.

c) Preparation of Arylated bis-2-aminothiophene Derivatives 0.2 mol of haloacylaryl derivative is initially charged with 0.1 mol of N,N'-di(2-phenylthioacetyl)-N,N'-diphenylphenylene-1,4-diamine in tetrahydrofuran and refluxed under a nitrogen atmosphere for 30 minutes. After 30 minutes, 0.2 mol of triethylamine is added and the mixture is refluxed for another 30 minutes. The product is precipitated in methanol in the form of bright yellow crystals.

ca) N,N'-Diphenyl-N,N'-dithiene-3,4-diphenyl-2-ylphenylene-1,4-diamine

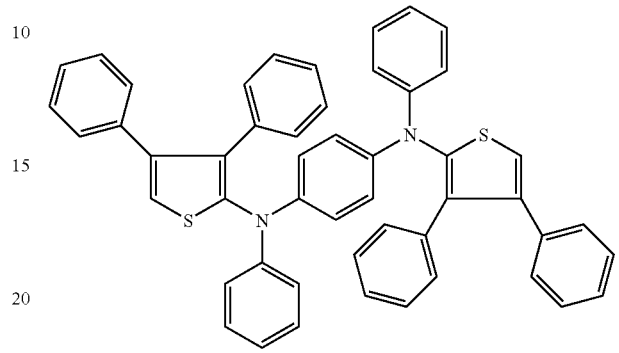

In this way, N,N'-diphenyl-N,N'-dithiene-3,4-diphenyl-2-ylphenylene-1,4-diamine (mp: 266-268° C.), for example, is prepared from N,N'-di(2-phenylthioacetyl)-N,N'-diphenylphenylene-1,4-diamine and phenacyl bromide.

cb) N,N'-Diphenyl-N,N'-dithiene-3-phenyl-4-(4-octylphenyl)-2-ylphenylene-1,4-diamine

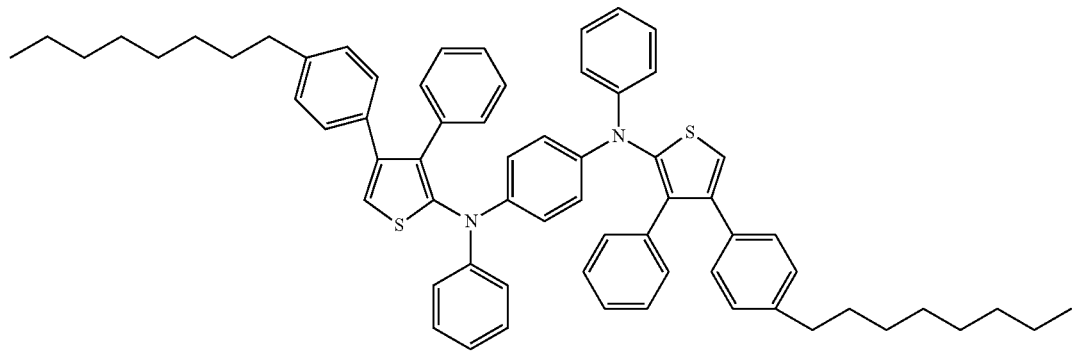

In this way, N,N'-diphenyl-N,N'-dithiene-3-phenyl-4-(4-octylphenyl)-2-ylphenylene-1,4-diamine (mp: 83° C.), for example, is prepared from N,N'-di(2-phenylthioacetyl)N,N'-diphenylphenylene-1,4-diamine and phenacyl bromide.

Example 3

Formation of the Structures $Ar^2(c)$ a) Synthesis of Arylated Carboxamides

In a 2 l three-necked flask with reflux condenser, magnetic stirrer, dropping funnel and inert gas supply, 1 mol in each case of a secondary diarylamine is dissolved in 600 ml of dioxane. The carbonyl halide required in each case is then added dropwise in the equivalent amount. Subsequently, the reaction mixture is heated under reflux until the entire amount of the hydrohalide formed in the reaction has been removed from the inert gas stream. Thin-layer chromatography monitoring allows the end of the reaction to additionally be detected. The reaction solution is then cooled and stirred into at least twice the amount of water. In most cases, this separates out an oil which has solidified after a few hours. The aqueous phase is removed and the crude product is recystallized from ethanol. The yield is in each case at least 90%.

aa) N-Phenyl-N-(1-naphthyl)-2-phenylacetamide

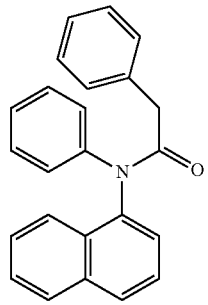

In this way, N-phenyl-N-(1-naphthyl)-2-phenylacetamide (mp: 85-88° C.), for example, is prepared from N-phenyl-N-(1-naphthyl)amine and 2-phenylacetyl chloride.

ab) N,N-Diphenyl-2-phenylacetamide

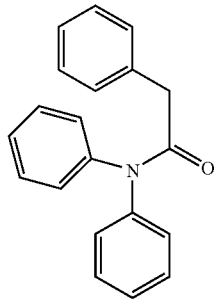

In this way, N,N-Diphenyl-2-phenylacetamide (mp: 71-72° C.), for example, is prepared from diphenylamine and 2-phenylacetyl chloride.

b) Synthesis of Arylated Thiocarboxamides 0.5 mol of the particular arylated carboxamide and the equivalent amount of Lawesson reagent (prepared from anisole and phosphorus pentasulfide) are suspended in a reflux apparatus with inert gas supply in 750 ml of diglycol diethyl ether, and then the mixture is stirred at 100° C. for 6 h. This forms a clear solution from which the reaction product crystallizes out under cold conditions in some cases. In order to isolate the product fully, the reaction mixture is stirred into double the amount of water, and the oily phase which often forms can then be allowed to crystallize out. Afterward, the product is removed from the aqueous phase and recrystallized from methanol. The yield is in each case at least 90%.

ba) N-Phenyl-N-(1-naphthyl)-2-phenylthioacetamide

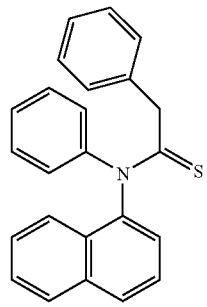

In this way, N-phenyl-N-(1-naphthyl)-2-phenylthioacetamide (mp: 100-103° C.), for example, is prepared from N-phenyl-N-(1-naphthyl)-2-phenylacetamide and the Lawesson reagent.

bb) N,N-Diphenyl-2-phenylthioacetamide

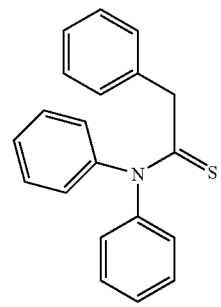

In this way, N,N-diphenyl-2-phenylthioacetamide (mp: 142-144° C.), for example, is prepared from N,N-diphenyl-2-phenylacetamide and the Lawesson reagent.

c) Preparation of 2,2'-diamino-4,4'-bisthienylarylenes 0.1 mol of bis(haloacyl)arylene derivative is initially charged with 0.2 mol of N,N-diaryl-2-arylthioacetamide in tetrahydrofuran and refluxed under nitrogen atmosphere for 30 minutes. After 30 minutes, 0.2 mol of trimethylamine is added and the mixture is refluxed for another 30 minutes. The product is precipitated in the form of colorless crystals in methanol.

ca) 2,2'-Diphenylamino-3,3'-diphenyl-4,4'-bisthienyl-p-phenylene

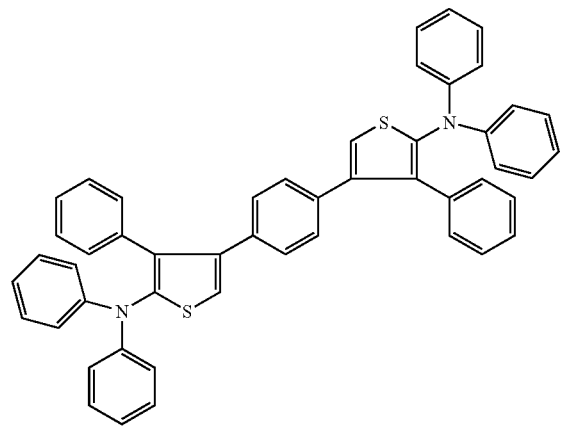

In this way, 2,2'-diphenylamino-3,3'-diphenyl-4,4'-bisthienyl-p-phenylene (mp: 232-235° C.), for example, is prepared from N,N-diphenyl-2-phenylthioacetamide and bis-ω-bromoacetyl-p-phenylene.

Synthesis of Conjugated, Fused and Oligoaryl Systems C

Example 4

Synthesis of 1,4-didurylbenzo-b-thiadiazole

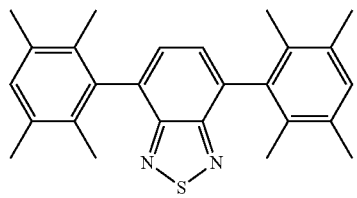

0.04 mol of durylboronic acid (Example 1c) is initially charged in a 1-liter 3-neck flask with 600 ml of toluene, admixed with 0.04 mol of propane-1,3-diol and heated on a water separator until no further water is separated out. The water separator is then removed and replaced by a reflux condenser, and 0.01 mol of 1,4-dibromobenzo-b-thiadiazole and 11.6 g of potash dissolved in 42 ml of water are added to the reaction mixture. The flask is then repeatedly evacuated under reduced pressure and flooded with argon in order to add the catalyst, tetrakis(triphenylphosphine)palladium. Finally, the mixture is heated to 110° C. for 48 h and purged with argon during this time. For workup, the organic phase is repeatedly washed with water, extracted and concentrated to dryness. The residue is washed in methanol and filtered off with suction. The crude product is purified by chromatography on silica gel by means of toluene.

Checking of the product by HPLC-MS coupling, $M^+=400$.

Synthesis of the Dibromoarylenes A*

Example 5

Preparation of 2,7-di(4-bromo-2,3,5,6-tetramethylphenyl)-9,9-diheptylfluorene

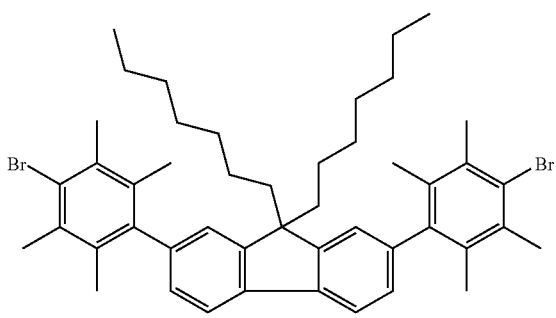

0.01 mol of 2,7-di(2,3,5,6-tetramethylphenyl)-9,9-diheptylfluorene are dissolved in 100 ml of chloroform, admixed with 0.5 g of $FeCl_3$ and stirred at room temperature. Under dark conditions, 0.025 mol of bromine dissolved in chloroform is slowly added dropwise. The reaction is stirred for approx. 12 hours. When the reaction solution has become decolorized, the bromination has ended (TLC monitoring on silica gel in cyclohexane). For workup, the solution is washed with water, the organic phase is extracted, then all of the chloroform is distilled off and the product is precipitated in methanol as white crystals; checking by HPLC-MS coupling, $M^+=783, 785$.

Synthesis of the Dibromoarylenes B*

Example 6

Formation of the Structures $Ar^2(a)$ a) Dialkylation of 2-bromofluorene 0.1 mol of 2-bromofluorene is dissolved in DMSO under a nitrogen atmosphere at approx. 50° C. with constant stirring. The dissolved 2-bromofluorene is admixed with 0.25 mol of potassium tert-butoxide, whereupon the reaction mixture turns dark red. After 5 minutes, 0.25 mol of an alkyl bromide R—Br is added; the reaction proceeds at room temperature overnight and has ended when a color change from red to bright yellow occurs.

The DMSO phase is washed with water and extracted with ether. The ether is distilled off by means of a rotary evaporator and the product is precipitated with methanol in the form of bright yellow crystals.

aa) 2-Bromo-9,9-diheptylfluorene

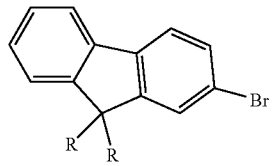

In this way, 2-bromo-9,9-diheptylfluorene (mp: 32° C.), for example, is prepared from 2-bromofluorene and heptyl bromide in the presence of potassium tert-butoxide.

b) Chloroacetylation of 9,9-dialkyl-2-bromofluorenes 0.1 mol of 9,9-diheptyl-2-bromofluorene is initially charged in methylene chloride and cooled to −15° C. with liquid nitrogen. At −15° C., 0.15 mol of chloroacetyl chloride and then 0.3 mol of aluminum chloride are added slowly. The reaction is then stirred overnight (at least 12 h).

The mixture is poured into ice/water/HCl (500 ml:500 ml:50 ml) and stirred for 20 minutes. The mixture is then washed once more with water. The organic phase is removed and the solvent is distilled off. The product precipitates out in the form of white crystals in methanol.

ba) 2-Bromo-7-chloroacetyl-9,9-diheptylfluorene

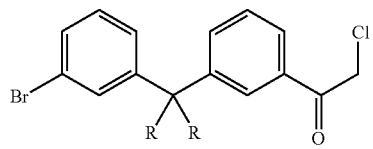

In this way, 2-bromo-7-chloroacetyl-9,9-diheptylfluorene (mp: 83-4° C.), for example, is prepared from 2-bromo-9,9-diheptylfluorene and chloroacetyl chloride under Friedel-Crafts conditions.

c) Preparation of Arylated 2-aminothiophene Derivatives 0.1 mol of haloacylaryl derivative is initially charged with 0.1 mol of N,N-diaryl-2-phenylthioacetamide (Example 3b) in tetrahydrofuran and refluxed under a nitrogen atmosphere for 30 minutes. After 30 minutes, 0.1 mol of trimethylamine is added and the mixture is refluxed once again for 30 minutes. The product is precipitated in the form of yellowish crystals in methanol.

ca) 2-(Phenyl-1-naphthylamino)-3-phenyl-4-p-bromophenylthiophene

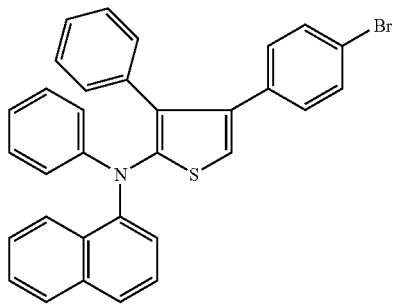

In this way, 2-(phenyl-1-naphthylamino)-3-phenyl-4-p-bromophenylthiophene (ESI-MS: M+1$^+$=532), for example, is prepared from N-phenyl-N-(1-naphthyl)-2-phenylthioacetamide and p-bromophenacyl bromide.

cb) 2-(Phenyl-1-naphthylamino)-3-phenyl-4-(7-bromo-9,9-diheptylfluoren-2-yl)thiophene

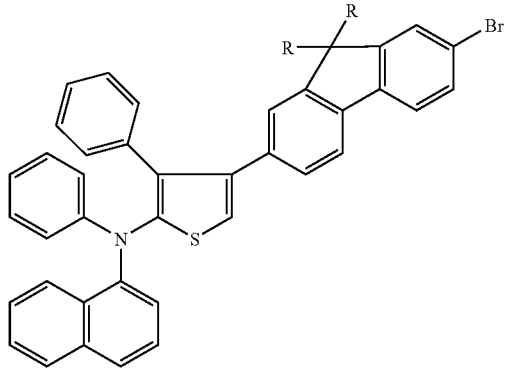

In this way, 2-(phenyl-1-naphthylamino)-3-phenyl-4-(7-bromo-9,9-diheptylfluoren-2-yl)thiophene with R=heptyl (ESI-MS: M+1$^+$=816), for example, is prepared from N-phenyl-N-(1-naphthyl)-2-phenylthioacetamide and 2-chloroacetyl-7-bromo-9,9-diheptylfluorene.

d) Preparation of dibromoarylene Derivatives with Hole Transport Properties by Oxidation of the 2-aminothiophene Derivatives 0.1 mol of 2-aminothiophene derivative is initially charged with 0.5 mol of FeCl$_3$ in methylene chloride and stirred for one day. The product is admixed with water and 0.1 mol of triethylamine and the organic solvent is distilled off. The product then precipitates out in the form of yellow crystals in the water phase which remains. Purification by column chromatography on silica gel with toluene.

da) bis[2-(Phenyl-1-naphthylamino)-3-phenyl-4-(7-bromo-9,9-diheptylfluoren-2-yl]-5,5'-thienyl

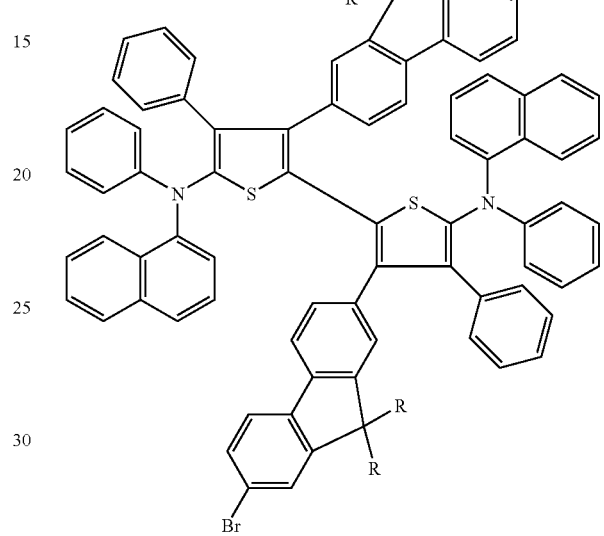

In this way, bis[2-(phenyl-1-naphthylamino)-3-phenyl-4-(7-bromo-9,9-dialkylfluoren-2-yl]-5,5'-thienyl where R=heptyl (ESI-MS: M=1$^+$=1629), for example, is prepared from 2-(phenyl-1-naphthylamino)-3-phenyl-4-(7-bromo-9,9-diheptylfluoren-2-ylthiophene and iron(III) chloride.

db) bis[2-(Phenyl-1-naphthylamino)-3-phenyl-4-(4-bromophenyl)]-5,5'-thienyl

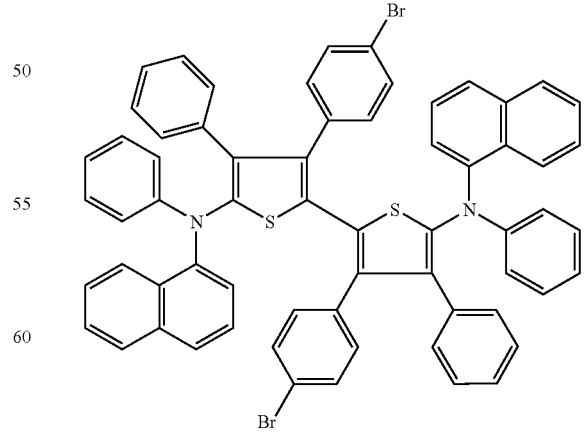

In this way, bis[2-(phenyl-1-naphthylamino)-3-phenyl-4-(4-bromophenyl)]-5,5'-thienyl (mp: 133-4° C.), (ESI-MS:

M+1+=1061), for example, is prepared from 2-(phenyl-1-naphthylamino)-3-phenyl-4-(4-bromophenyl)thiophene and iron(III) chloride.

Synthesis of the Dibromoarylenes C*

Example 7

Formation of the Structures Ar³(e)

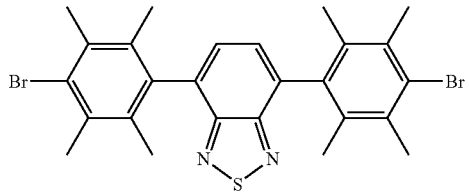

0.01 mol of 1,4-didurylbenzo-b-thiadiazole (Example 4) is dissolved in 100 ml of chloroform, admixed with 0.5 g of FeCl₃ and stirred at room temperature. Under dark conditions, 0.025 mol of bromine dissolved in chloroform is slowly added dropwise. The reaction is stirred for approx. 12 hours. When the reaction solution has become decolorized, the bromination has ended (TLC monitoring on silica gel in toluene). For workup, the solution is washed with water, the organic phase is extracted, then all of the chloroform is distilled off and the product is precipitated in methanol in the form of yellowish crystals, checking by ESI-MS (M+1+=557).

Synthesis of the Bromoaryl Systems (R—Br)

Example 8

Synthesis of 4-bromo-2,3,5,6-tetramethylphenyldiphenylamine

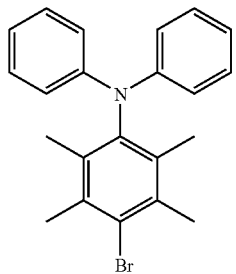

An apparatus for working under inert conditions and exclusion of moisture is initially charged with 0.1 mol of diphenylamine, 0.4 mol of dibromodurene and 0.12 mol of sodium tert-butoxide. The catalyst used for C—N coupling is Pd₂(dba)₃/(t-Bu)₃P=⅙ in a concentration of 1 mol % based on the amine. The reaction solution is heated at reflux until diphenylamine can no longer be detected by TLC comparison. For workup, the reaction solution is washed to neutrality and the organic phase is extracted. Afterward, the solvent is removed under reduced pressure, 200 ml of cyclohexane are added and the insoluble crystal slurry is filtered off with suction from dibromodurene. The filtrate is concentrated until crystallization commences again and chromatographed on silica gel with cyclohexane. Checking by HPLC-MS coupling (C18RP/10 μm/methanol/RT=7.06 min/99%, M+=379).

Synthesis of the Lithiated Arene Systems D, E, F and I*

Example 9

General Method

In an apparatus as is customary in organometallic chemistry, 0.1 mol of highly purified and dried dibromoarylene component (A*, B*, C*), bromoaryl component (R—Br) or the unbrominated arenes (A, B, C) with terminal thiophene substituents are dissolved with exclusion of moisture and under an inert atmosphere in 600 ml of THF and cooled to −78° C. Afterward, butyllithium is added slowly in a 20% excess through a septum and the temperature is kept at −78° C. for a further hour. After thawing, the lithiated arenes may be processed further directly from the solution. The synthesis of the lithiated arenes required for the polymer synthesis should as far as possible be carried out in parallel in order to be able to use them freshly.

a) 9,9-Diheptyl-2,7-fluorenylenedilithium

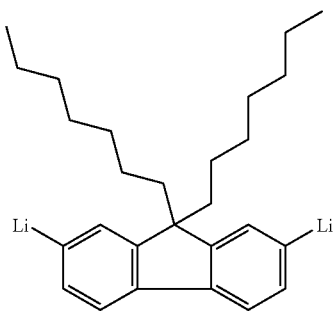

In this way, 9,9-diheptyl-2,7-fluorenylenedilithium, for example, is prepared from 9,9-diheptyl-2,7-dibromofluorene and butyllithium.

b) Diphenylamino-2,3,5,6-tetramethylphenyl-4-yl-lithium

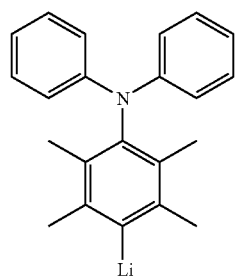

In this way, diphenylamino-2,3,5,6-tetramethylphenyl-4-yllithium, for example, is prepared from 4-bromo-2,3,5,6-tetramethylphenyldiphenylamine and butyllithium.

Synthesis of Arene Systems D*, E*, F* and I as Grignard Reagents

Example 10

General Method 0.25 mol of freshly corroded magnesium turnings are initially charged under an argon atmosphere in dry ether. With stirring and refluxing, 0.1 mol of highly purified and dried dibromoarylene components (A*, B*, C*) or bromoaryl component (R—Br), dissolved in 300 ml of THF, was added dropwise at such a rate that the reaction mixture was kept at boiling after the start of the reaction. The end of the reaction is detected by TLC by comparing the organic phase of a sample admixed with water with the particular brominated and unbrominated arene. When the particular unbrominated arene is detected, the arene solution in the form of the Grignard reagent is available for further work. The synthesis of the Grignard compounds required for the polymer synthesis should as far as possible be carried out in parallel in order to be able to use them freshly.

a) 9,9-Diheptyl-2,7-fluorenylenedimagnesium bromide

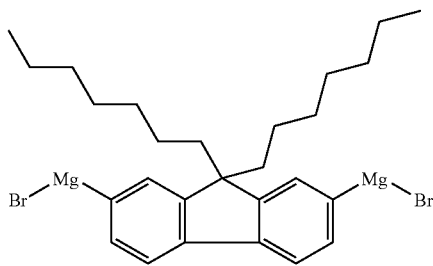

In this way, 9,9-diheptyl-2,7-fluorenylenemagnesium bromide, for example, is prepared from 9,9-diheptyl-2,7-dibromofluorene and magnesium.

Synthesis of the Arylboronic Acid Derivatives G*

Example 11

Preparation of Arylboronic Esters/General Method

One of the aryllithium compounds synthesized according to Example 9 or one of the aryl Grignard compounds synthesized according to Example 10 is slowly added dropwise at −78° C. with exclusion of moisture and under inert conditions to an ethereal solution which comprises one equivalent of trimethyl borate. After thawing to room temperature, the mixture is stirred for another 12 h, then the reaction solution is available for further reaction.

a) Dimethyl mesitylboronate

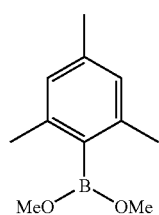

In this way, dimethyl mesitylboronate, for example, is prepared from mesitylmagnesium bromide and trimethyl borate.

Synthesis of the Linear Copolyfluoroaryleneboranes H

Example 12

General Method

The desired proportions of the prepared Grignard compounds (D*, E* and F*) or the corresponding lithium organyls (D, E and F), dissolved in THF, are transferred under argon and with exclusion of moisture to a flask which is equipped with dropping funnel, reflux condenser, stirrer and argon atmosphere. Via a septum, boron trifluoride etherate is metered into the dropping funnel according to the sum of the molar proportions of the Grignard compounds and added dropwise at room temperature within 30 min. After the dropwise addition, the temperature is increased to 60° C.; after a further 2 h of reaction time, the now formed copolyfluoroaryleneborane H is available for the next reaction.

a) Polyfluoro(9,9-diheptyl)-2,7-fluoreneborane

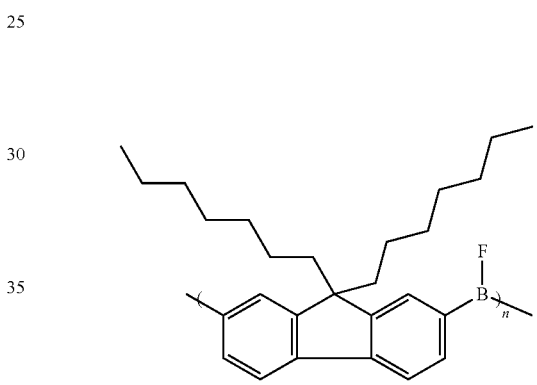

In this way, polyfluoro(9,9-diheptyl)-2,7-fluoreneborane, for example, is prepared from 9,9-diheptyl-2,7-fluorenylenemagnesium bromide and boron trifluoride etherate.

Synthesis of the Copolyboranes K

Example 13 a) From Copolyfluoroaryleneborane H and a Magnesium Organyl I or a Lithium Organyl I*

First, the reflux condenser of the apparatus is replaced by a distillation head with condenser and the THF solvent is distilled off. At the same time, the dropping funnel is filled with about the same volume as the reaction mixture of dry toluene and is added dropwise as the solvent instead of the THF. On completion of the solvent exchange, the desired dissolved Grignard compound I or aryllithium compound I* is metered into the dropping funnel under argon atmosphere and with exclusion of moisture in a stoichiometric ratio based on the copolyfluoroaryleneborane H, and slowly added dropwise with gently boiling toluene. At the same time, the solvent (THF) of the Grignard compound I or aryllithium compound I* being added dropwise is distilled off. After removal of the THF, the distillation head with condenser is again exchanged for the reflux condenser and the mixture is heated at reflux for a further 5 h.

After cooling, the reaction mixture is poured onto ice/HCl and the toluene phase is removed. The toluene is distilled off fully on a rotary evaporator, then the residue is dissolved in a little THF and precipitated in ethanol with stirring. Further purification of the product is effected by repeated dissolution in THF and precipitation again in ethanol.

aa)
Polymesityl(9,9-diheptyl)-2,7-fluorenyleneborane

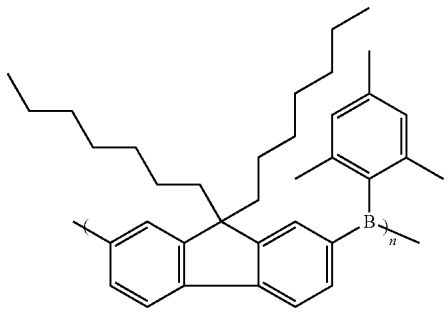

In this way, polymesityl(9,9-diheptyl)-2,7-fluorenyleneborane (MW: 21 000, Tg: 110° C., CV reversible on reduction), for example, is prepared from polyfluoro(9,9-diheptyl)-2,7-fluorenyleneborane and mesitylmagnesium bromide.

ab) Poly(2-diphenylamino-3,4-diphenylthien-5-yl)(9,9-diheptyl-2,7-fluorenylene)borane

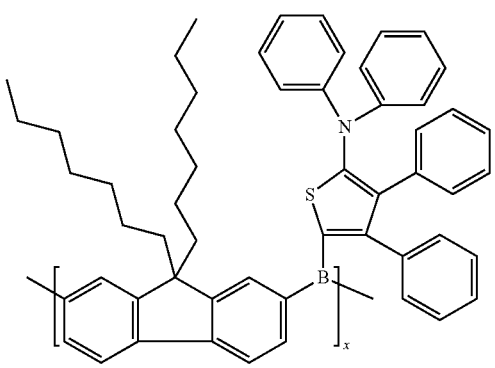

In this way, poly(2-diphenylamino-3,4-diphenylthien-5-yl)(9,9-diheptyl-2,7-fluorenylene)borane (MW: 19 000, Tg: 135° C., CV: reversible on oxidation and reduction), for example, is prepared from polyfluoro(9,9-diheptyl)-2,7-fluorenyleneborane and 2-diphenylamino-3,4-diphenylthiophene.

ac) Poly(4-diphenylamino-2,3,5,6-tetramethylphenyl)[(9,9-diheptyl)-2,7-di(2,3,5,6-tetramethylphen-4-yl)fluorenylene]borane

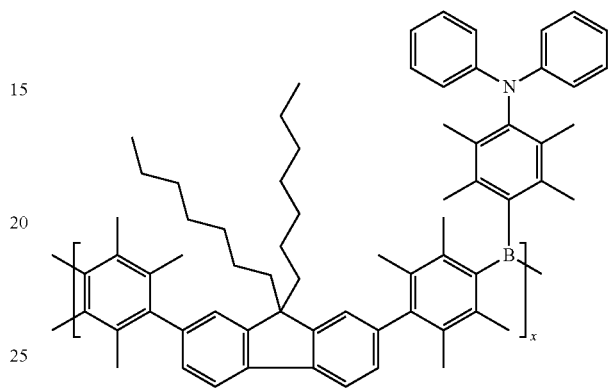

In this way, poly(4-diphenylamino-2,3,5,6-tetramethylphenyl)-[(9,9-diheptyl)-2,7-di(2,3,5,6-tetramethylphen-4-yl)fluorenylene]borane, for example, is prepared from polyfluoro[(9,9-diheptyl)-2,7-di(2,3,5,6-tetramethylphen-4-yl)fluorenylene]borane and 4-bromo-2,3,5,6-tetramethylphenyldiphenylamine.

Cyclic voltammetry: on polymer ac shows the desired oxidative and reductive reversibility and stability over several cycles. See FIG. 1.

b) From the Metal Organyls (D, D*, E, E*, F, F*) and an Arylboronic Ester G*

Under absolutely dry and inert conditions, the metal organyls required to form the desired copolyborane are mixed in a flask according to the desired stoichiometry and the desired arylboronic ester is subsequently added in the stoichiometric ratio with stirring.

The temperature is initially increased to 60° C. for 2 h, then the reflux condenser of the apparatus is replaced by a distillation head with condenser and the THF solvent is distilled off. At the same time, the dropping funnel is filled with about the same volume as the reaction mixture of dry toluene and added dropwise as the solvent instead of the THF. On completion of the solvent exchange, the distillation head with condenser is exchanged again for the reflux condenser and the mixture is heated at reflux for a further 5 h.

After cooling, the reaction mixture is poured onto ice/HCl and the toluene phase is removed. The toluene is distilled off fully on a rotary evaporator, then the residue is dissolved in a little THF and precipitated in ethanol with stirring. Further purification of the product is effected by repeated dissolution in THF and precipitation again in ethanol.

ba) Poly[(mesityl(9,9-diheptyl-2,7-fluorenylene)co-polymesityl-N,N'-diphenyl-N,N'-dithiene-3-phenyl-4-(4-octylphenyl)-2-yl-5,5'-ylenephenylene-1,4-diamine]-borane

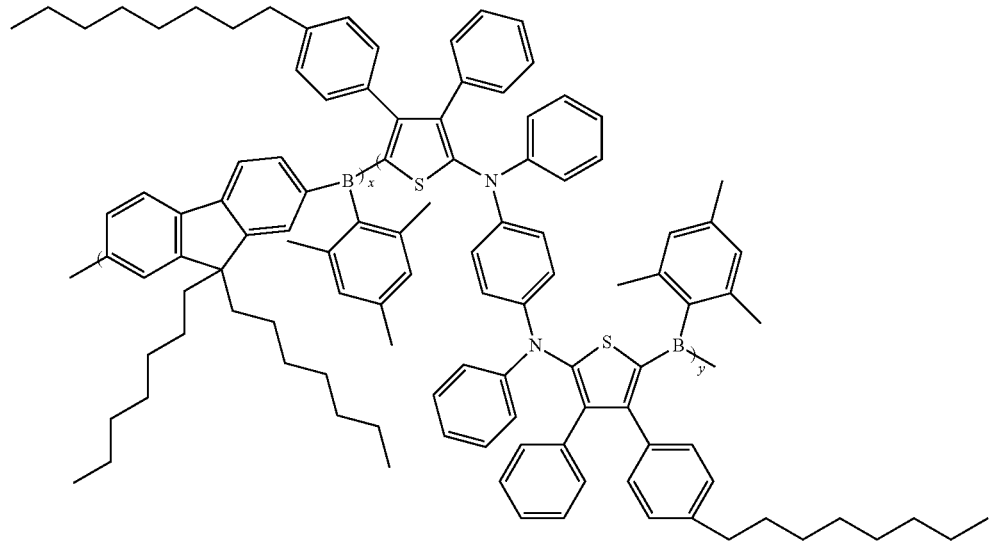

In this way, the copolymer ba (CV reversible on oxidation and reduction, MW: 20 000), for example, is prepared from 0.8 molar part of the substituted fluorene component, 0.2 molar part of the substituted diamine component and 1.0 molar part of dimethyl mesitylboronate.

OLED Characteristics

Example 14

Figure 3:
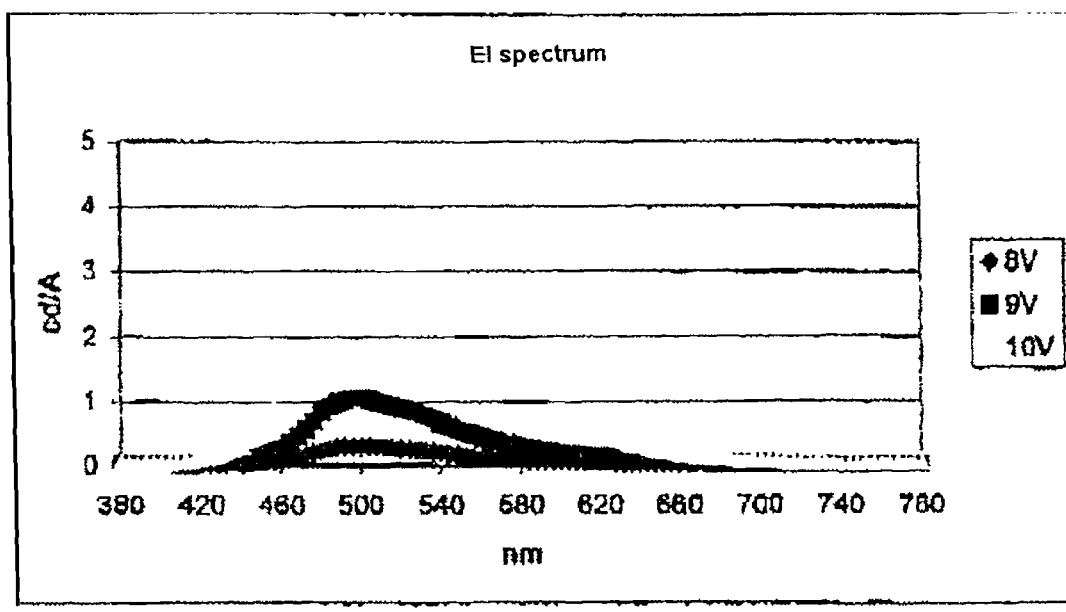
FIG. 3 shows the EI spectrum at varying voltages.

An OLED was constructed by the following layer sequence:
Anode: ITO (indium tin oxide)
80 nm of PEDOT
80 nm of emitter (polymesityl(9,9-diheptyl)-2,7-fluorenyleneborane) (according to Example 13aa)
Cathode 3 nm of Ba, 300 nm of Al
a) Current Density See FIG. 3.
b) Efficiency See FIG. 3.
c) CIE data of the OLED: 0.24×0.46 (at 10 V)

The novel materials are suitable for obtaining electroluminescent diodes in the different colors of the visible spectral region (blue to red). These materials can also be converted by copolymerization reactions in appropriate ratios to materials which electroluminesce at or close to the white point.

These polymeric materials can be processed by all processes applicable from solution (for example spincoating, knifecoating, screenprinting, inkjet printing).

The materials are obtainable preparatively in high yields and derive from arylated boranes, and the electronic properties and thus also the color of the particular compound are influenced by the selection of the arylene fragments (donor/acceptor structure).

Particular emphasis should be given to the fact that the formation of these polymeric materials does not require any metal catalysis-based coupling reactions which are otherwise customary (this also eliminates the costly and inconvenient removal of the catalyst and also the risk of contamination of the polymer by quencher particles), which greatly reduces the costs of the synthesis owing to the expensive palladium catalysts which are not required and their removal.

Specifically white-emitting materials are of great interest for the production of light sources and full-color displays in which the full color is achieved by filtering. The advantage of the white light-driven full-color displays consists in the color-independent aging of the emitting material.

The invention is not restricted by the description on the basis of the exemplary embodiments. Rather, the invention encompasses any new feature and also any combination of features, which in particular comprises any combination of features in the patent claims, even if said feature or said combination is itself not explicitly specified in the patent claims or exemplary embodiments.

What is claimed is:
1. A K type of copolyarylborane:

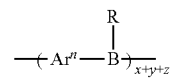

wherein:
hydrogen atoms are bonded to the ends;
$Ar^n$ represents at least one of $Ar^1$, $Ar^2$, and $Ar^3$;
Wherein $Ar^1$ and $Ar^2$, independent of each other, are selected from mono (homo)aromatic arylenes, and polycyclic heteroaromatic arylenes; $Ar^3$ represents an heteroaromatic arylene radical; and each of $Ar^1$, $Ar^2$, and $Ar^3$ is bonded in the K type of copolyarylborane in a bivalent conjugating manner;
$Ar^1$ has π electron density of no less than that of benzene;
$Ar^2$ is capable of hole transport;
$Ar^3$ has a π electron density of no greater than that of benzene and less than that of $Ar^1$;
wherein $Ar^1$ is different from $Ar^2$ and $Ar^3$ and wherein $Ar^2$ is different from $Ar^3$;
x, y, and z respectively represent the molar parts of $Ar^1$, $Ar^1$, and $Ar^3$; each of x, y,
and z is in the range of 0-1, and x+y+z=1, wherein two of x, y, and z are not equal to 0; and depending on the intended conjucation in the K type of copolyarylborane, R represents one of the following radicals:

(1) a heteroaromatic or a (homo)aromatic aryl radical, which is donor-free, wherein R's conjugation in the copolyarylborane is formed by application of an electrical field;

(2) a heteroaromatic or a (homo)aromatic aryl in which at least one additional donor function is substituted (intrinsic formation of conjugation); and (3) a heteroaromatic or a (homo)aromatic aryl whose hydrogen atom(s) is substituted by one or more branched or unbranched alkyl radicals or alkoxy radicals R*.

2. The copolyarylborane of claim 1 wherein at least one of Ar'' and R is substituted at an ortho position of a boron-carbon bond.

3. The copolyarylborane of claim 2 wherein at least one ortho substituent is a methyl substituent or a 3,6-durylene substituent arranged between a boron atom and an arylene radical.

4. The copolyarylborane of claim 1 wherein the copolyarylborane is one of the following compounds:

5. The copolyarylborane of claim 1 wherein $Ar^1$ has a 2,7-fluorenylene structure.

6. The copolyarylborane of claim 5 wherein the 2,7-fluorenylene structure is substituted in the 9 position by an unbranched or branched alkyl radical.

7. The copolyarylborane of claim 1 wherein $Ar^1$ is selected from the compounds of the $Ar^1$(a-h) types shown in Table 1:

TABLE 1

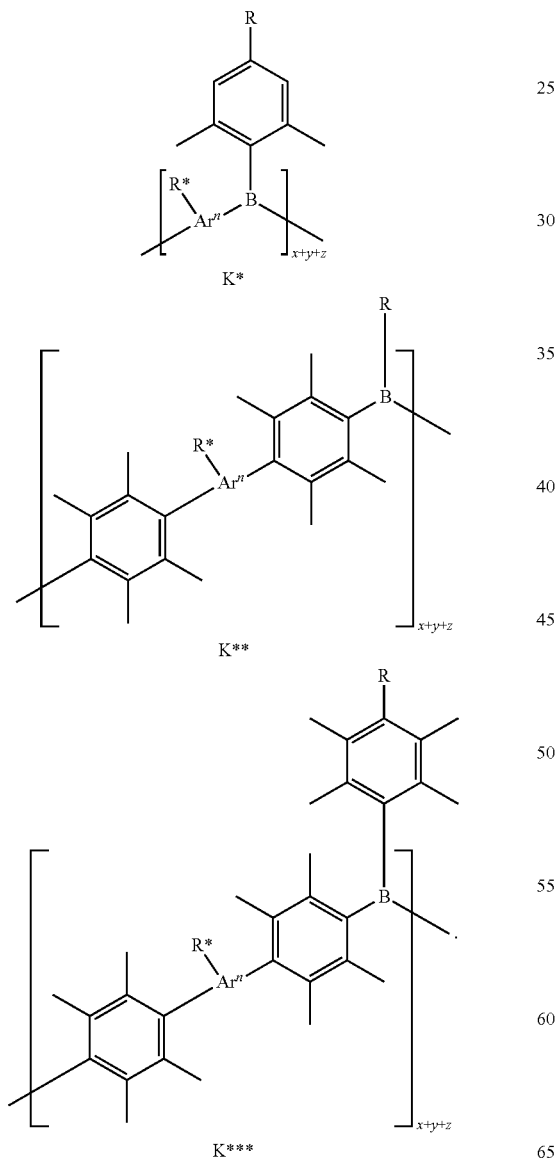

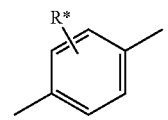

$Ar^1$(a1)
1,4-phenylene

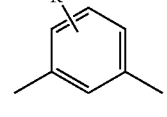

$Ar^1$(a2)
1,3-phenylene

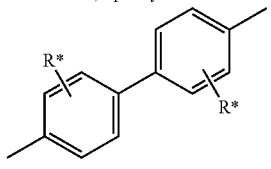

$Ar^1$(b1) 1,1'-
(4,4'-biphenylene)

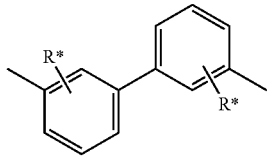

$Ar^1$(b2) 1,1'-(3,3'-
biphenylene)

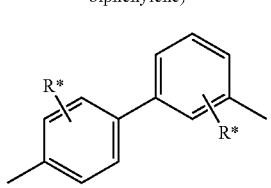

$Ar^1$(b3) 1,1'-(3,4'-
biphenylene)

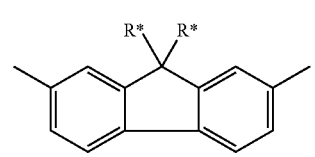

$Ar^1$(c)
2,7-fluorenylene

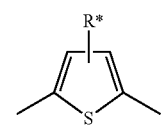

$Ar^1$(d)
2,5-thienylene

TABLE 1-continued

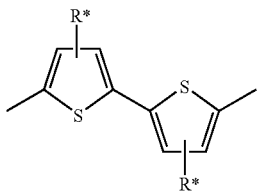

Ar¹(e) 2,2'-(5,5'-bisthienylene)

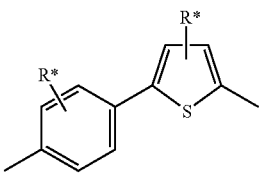

Ar¹(f1) 4',5-(2-phenylthienylene)

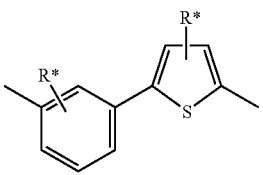

Ar¹(f2) 3',5-(2-phenylthienylene)

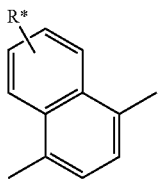

Ar¹(g1) 1,4-naphthylene

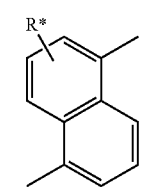

Ar¹(g2) 1,5-naphthylene

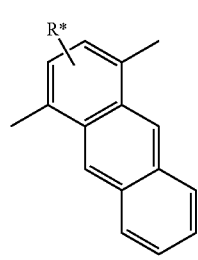

Ar¹(h1) 1,4-anthrylene

TABLE 1-continued

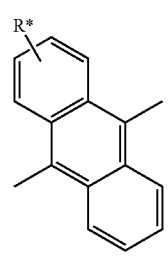

Ar¹(h2) 9,10-anthrylene

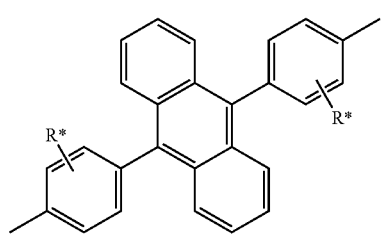

Ar¹(h3) 4',4'-bis-(9,10-diphenyl)-anthrylene where R* represents a branched or unbranched alkyl or alkoxy radical.

8. The copolyarylborane of claim 1 wherein Ar² has a perarylated amine substituent attached in a conjugating manner.

9. The copolyarylborane of claim 1 wherein Ar² is selected from the compounds of the Ar²(a-f) types shown in Table 2:

TABLE 2

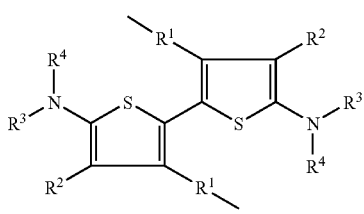

Ar² (a)
[bis(2,2'diarylamino-3,3'-diaryl-5,5'thiene)]-4,4'-ylene

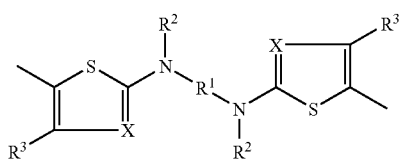

Ar² (b)
[N,N'-bis(thien-2-yl)- or N,N'-bis-(1,3-thiazol-2-yl)-N,N'-diaryldiaminoarylene]-5,5'-ylene TABLE 2-continued Ar² (c)
[bis(2,2'-diarylamino)-3,3'-diaryl-4,4'-thienyl)arylene]-5,5'-ylene Ar² (d)
[N,N'-bis(3-duryl)-N,N'-diaryldiaminoarylene]-6,6'-ylene Ar² (e)
Bis[(5,5-diarylaminophenyl)arlene]-2,2'-ylene Ar² (f)
bis(4,4'-diarylaminophenyl) 2,2'-ylene wherein R², R³ and R⁴ are aryl substituents; R¹ is a substituent having the same definition as applied to Ar¹ in claim 1; and x is N or C—R⁴.

10. The copolyarylborane of claim 9 wherein the substituents R², R³ and R⁴ are selected from the group consisting of phenyl, 1-naphthyl and 2-naphthyl.

11. The copolyarylborane of claim 9 wherein R¹ is one of Ar¹ as shown in table 2 of claim 9.

12. The copolyarylborane of claim 9 wherein R¹ is selected from the group consisting of 9,9-dialkyl-2,7-fluorenylene and 3,6-durylene.

13. The copolyarylborane of claim 1 wherein Ar³ is selected from the compounds of the Ar³(a-m) types shown in Table 3:

TABLE 3

Ar³ (a1)
2,6-(diarylene)pyridinylenes

Ar³ (a2)
2,5-(diarylene)pyridinylenes

Ar³ (b)
2,5-(diarylene)pyrazinylenes

Ar³ (c) 3,6-(diarylene)-1,2,4-triazinylenes

Ar³ (d1)
1,4-(diarylene)phthalazinylenes

Ar³ (d2)
2,3-(diarylene)quinoxalinylenes

TABLE 3-continued
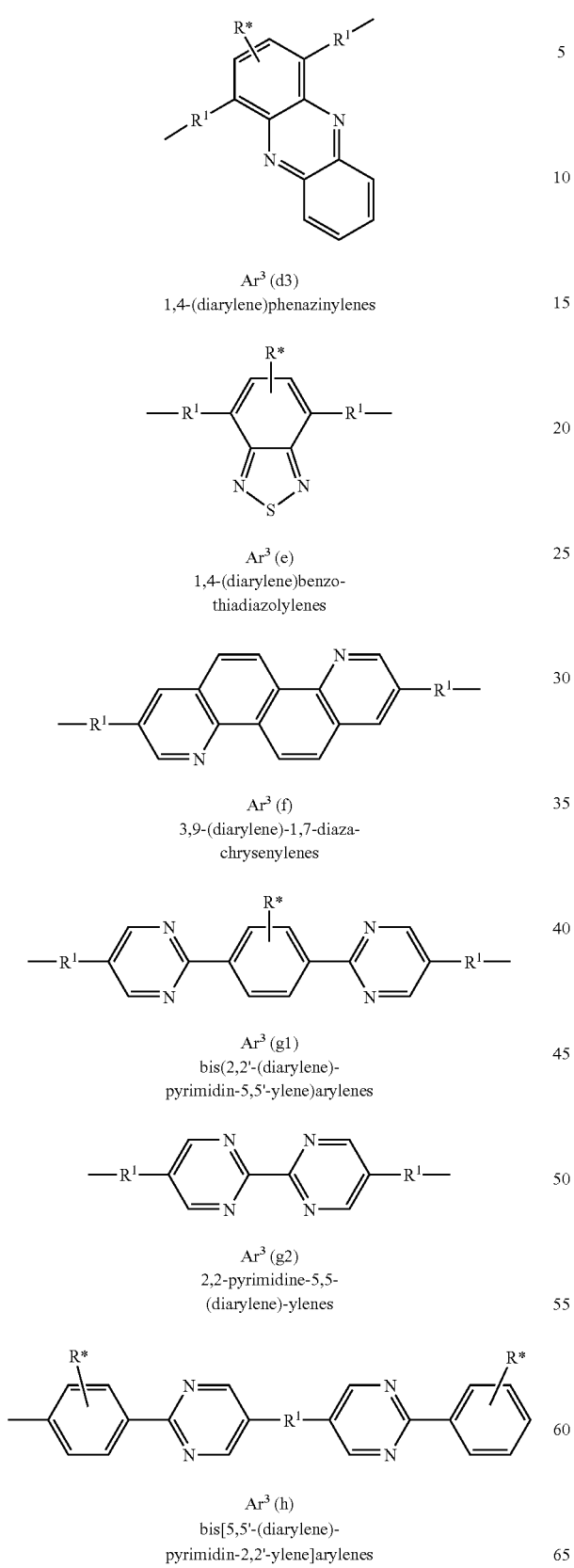
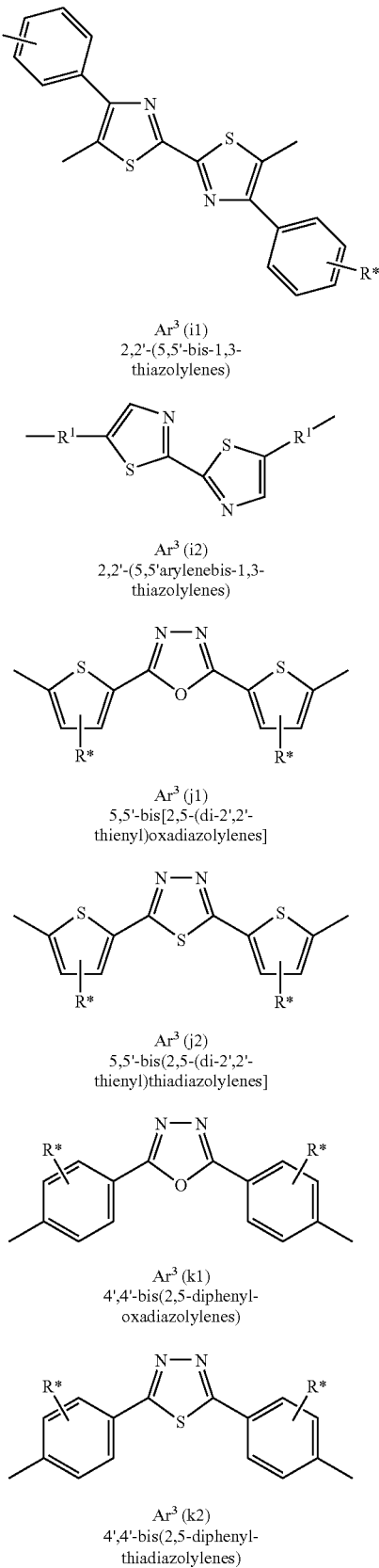

TABLE 3-continued

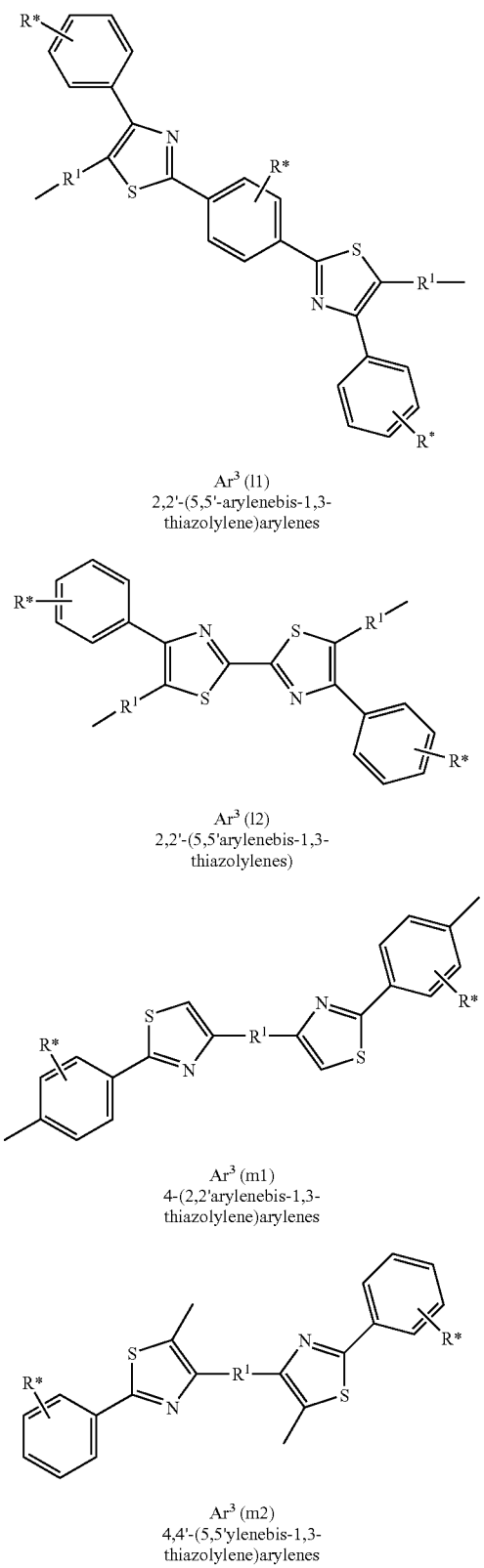

Ar³ (l1)
2,2'-(5,5'-arylenebis-1,3-thiazolylene)arylenes

Ar³ (l2)
2,2'-(5,5'arylenebis-1,3-thiazolylenes)

Ar³ (m1)
4-(2,2'arylenebis-1,3-thiazolylene)arylenes

Ar³ (m2)
4,4'-(5,5'ylenebis-1,3-thiazolylene)arylenes wherein $R^1$ is a substituent having the same definition as applied to Ar¹ in claim 1, and R* is a branched or unbranched alkyl or alkoxy radical.

14. The copolyarylborane of claim 1 wherein R is selected from the compounds of the types shown in Table 4:

TABLE 4

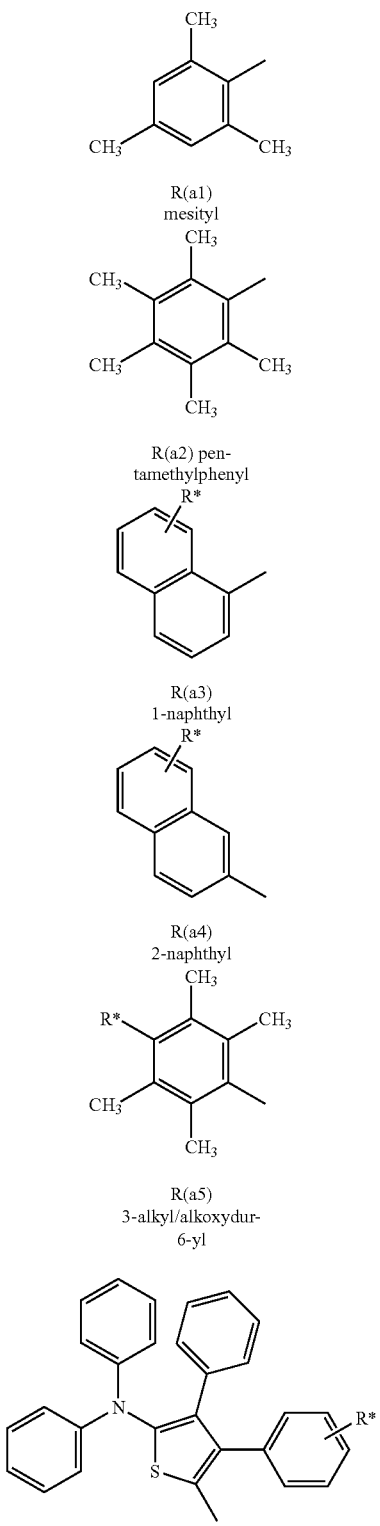

R(a1)
mesityl

R(a2) pentamethylphenyl

R(a3)
1-naphthyl

R(a4)
2-naphthyl

R(a5)
3-alkyl/alkoxydur-6-yl

R(b1)
2-diphenylamino
3,4-diphenylthien-

TABLE 4-continued
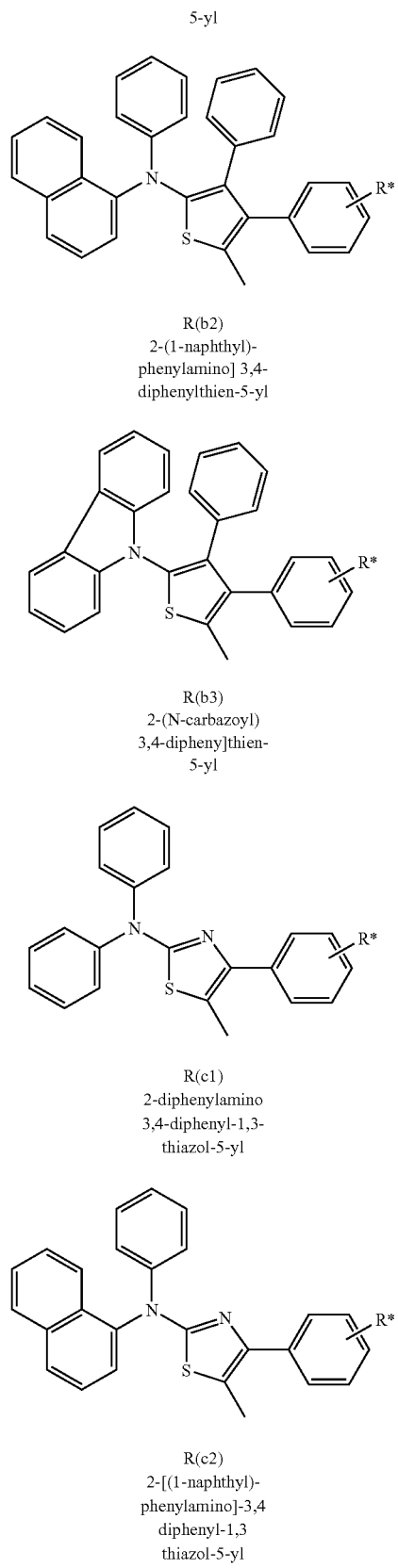
R(b2)
2-(1-naphthyl)-
phenylamino] 3,4-
diphenylthien-5-yl
R(b3)
2-(N-carbazoyl)
3,4-dipheny]thien-
5-yl
R(c1)
2-diphenylamino
3,4-diphenyl-1,3-
thiazol-5-yl
R(c2)
2-[(1-naphthyl)-
phenylamino]-3,4
diphenyl-1,3
thiazol-5-yl
TABLE 4-continued
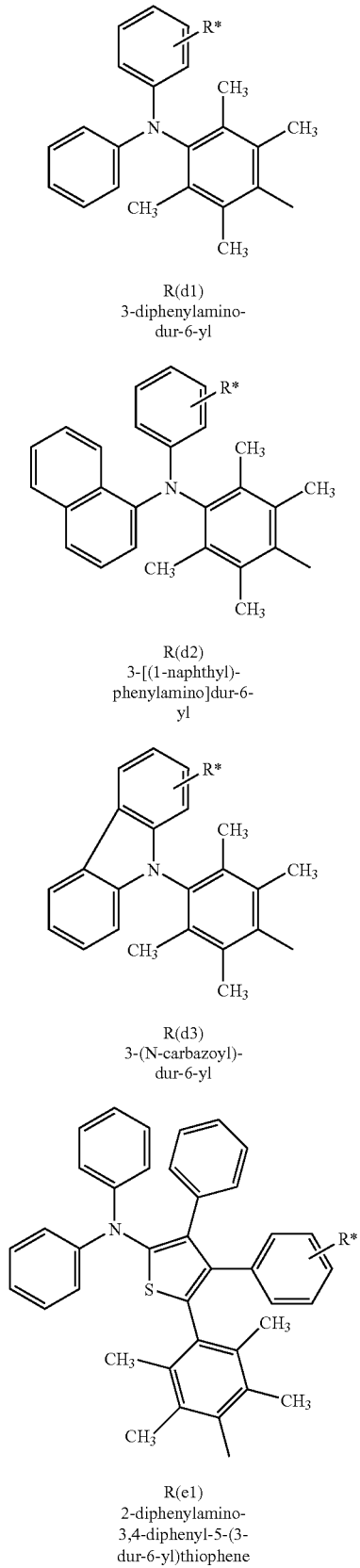
R(d1)
3-diphenylamino-
dur-6-yl
R(d2)
3-[(1-naphthyl)-
phenylamino]dur-6-
yl
R(d3)
3-(N-carbazoyl)-
dur-6-yl
R(e1)
2-diphenylamino-
3,4-diphenyl-5-(3-
dur-6-yl)thiophene TABLE 4-continued

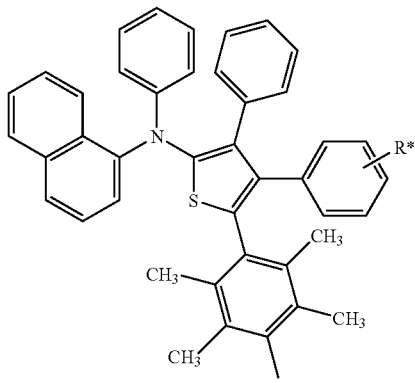

R(e2)
2-[(1-naphthyl)-
phenylamino]-3,4
diphenyl-5-(3-dur-
6-yl)thiophene

TABLE 4-continued

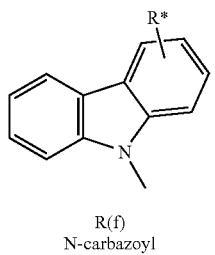

R(f)
N-carbazoyl wherein R* represents a branched or unbranched alkyl or alkoxy radical; R(a1-a5) is donor free; and R(b-e) has at least one donor function substituted.

15. The copolyarylborane of claim 1 wherein the of the copolyarylborane in organic solvents is improved by an additional arrangement of one or more unbranched and/or branched alkyl substituents and/or alkoxy substituents R*.

16. The copolyarylborane of claim 15 wherein one or more of the alkyl substituents have from 1 to 10 carbon atoms.

* * * * *